United States Patent
Khlat et al.

(10) Patent No.: US 9,431,974 B2
(45) Date of Patent: Aug. 30, 2016

(54) PSEUDO-ENVELOPE FOLLOWING FEEDBACK DELAY COMPENSATION

(71) Applicant: RF Micro Devices, Inc., Greensboro, NC (US)

(72) Inventors: Nadim Khlat, Cugnaux (FR); Michael R. Kay, Summerfield, NC (US); Philippe Gorisse, Brax (FR)

(73) Assignee: Qorvo US, Inc., Greensboro, NC (US)

( * ) Notice: Subject to any disclaimer, the term of this patent is extended or adjusted under 35 U.S.C. 154(b) by 123 days.

(21) Appl. No.: 14/101,770

(22) Filed: Dec. 10, 2013

(65) Prior Publication Data
US 2014/0097895 A1    Apr. 10, 2014

Related U.S. Application Data

(63) Continuation-in-part of application No. 13/316,229, filed on Dec. 9, 2011, now Pat. No. 8,633,766, which is a continuation-in-part of application No. 13/089,917, filed on Apr. 19, 2011, now Pat. No.
(Continued)

(51) Int. Cl.
*H03G 3/00* (2006.01)
*H03F 3/217* (2006.01)
(Continued)

(52) U.S. Cl.
CPC ........... *H03F 3/217* (2013.01); *H02M 3/07* (2013.01); *H03F 1/025* (2013.01); *H03F 1/0244* (2013.01); *H03F 1/0277* (2013.01); *H03F 1/42* (2013.01); *H03F 3/195* (2013.01); *H03F 3/245* (2013.01); *H03F 3/3022* (2013.01); *H03F 3/45475* (2013.01); *H03F 3/505* (2013.01);
(Continued)

(58) Field of Classification Search
CPC ............................................. H03G 3/00
USPC ................ 330/127, 297; 455/127.1; 323/222
IPC ................................................. H03G 3/00
See application file for complete search history.

(56) References Cited

U.S. PATENT DOCUMENTS

| | | |
|---|---|---|
| 3,969,682 A | 7/1976 | Rossum |
| 3,980,964 A | 9/1976 | Grodinsky |

(Continued)

FOREIGN PATENT DOCUMENTS

| | | |
|---|---|---|
| CN | 1076567 A | 9/1993 |
| CN | 1211355 A | 3/1999 |

(Continued)

OTHER PUBLICATIONS

Notice of Allowance for U.S. Appl. No. 13/948,291, mailed Feb. 11, 2015, 7 pages.
(Continued)

*Primary Examiner* — Patricia T Nguyen
(74) *Attorney, Agent, or Firm* — Withrow & Terranova, P.L.L.C.

(57) ABSTRACT

A switch mode power supply converter and a feedback delay compensation circuit are disclosed. The switch mode power supply converter has a switching voltage output and provides a switching voltage at the switching voltage output, such that a target voltage for a power amplifier supply voltage at a power amplifier supply output is based on the switching voltage. Further, the switching voltage is based on an early indication of a change of the target voltage. The feedback delay compensation circuit provides the early indication of the change of the target voltage.

19 Claims, 8 Drawing Sheets

Related U.S. Application Data 8,493,141, and a continuation-in-part of application No. 13/218,400, filed on Aug. 25, 2011, now Pat. No. 8,519,788, which is a continuation-in-part of application No. 13/089,917, filed on Apr. 19, 2011, now Pat. No. 8,493,141.

(60) Provisional application No. 61/421,348, filed on Dec. 9, 2010, provisional application No. 61/421,475, filed on Dec. 9, 2010, provisional application No. 61/469,276, filed on Mar. 30, 2011, provisional application No. 61/325,659, filed on Apr. 19, 2010, provisional application No. 61/376,877, filed on Aug. 25, 2010.

(51) Int. Cl.

| | |
|---|---|
| *H03F 1/02* | (2006.01) |
| *H02M 3/07* | (2006.01) |
| *H03F 1/42* | (2006.01) |
| *H03F 3/195* | (2006.01) |
| *H03F 3/24* | (2006.01) |
| *H03F 3/30* | (2006.01) |
| *H03F 3/45* | (2006.01) |
| *H03F 3/50* | (2006.01) |
| *H03F 3/72* | (2006.01) |
| *H02M 1/00* | (2006.01) |

(52) U.S. Cl.
CPC ....... *H03F 3/72* (2013.01); *H02M 2001/0025* (2013.01); *H03F 2200/102* (2013.01); *H03F 2200/204* (2013.01); *H03F 2200/36* (2013.01); *H03F 2200/375* (2013.01); *H03F 2200/451* (2013.01); *H03F 2200/555* (2013.01); *H03F 2200/78* (2013.01); *H03F 2203/45526* (2013.01); *H03F 2203/45544* (2013.01); *H03F 2203/45594* (2013.01); *H03F 2203/45694* (2013.01); *H03F 2203/45712* (2013.01); *H03F 2203/45718* (2013.01); *H03F 2203/7221* (2013.01)

(56) References Cited

U.S. PATENT DOCUMENTS

| | | | |
|---|---|---|---|
| 4,587,552 A | 5/1986 | Chin | |
| 4,692,889 A | 9/1987 | McNeely | |
| 4,831,258 A | 5/1989 | Paulk et al. | |
| 4,996,500 A | 2/1991 | Larson et al. | |
| 5,099,203 A | 3/1992 | Weaver et al. | |
| 5,146,504 A | 9/1992 | Pinckley | |
| 5,187,396 A | 2/1993 | Armstrong, II et al. | |
| 5,311,309 A | 5/1994 | Ersoz et al. | |
| 5,317,217 A | 5/1994 | Rieger et al. | |
| 5,339,041 A | 8/1994 | Nitardy | |
| 5,351,087 A | 9/1994 | Christopher et al. | |
| 5,414,614 A | 5/1995 | Fette et al. | |
| 5,420,643 A | 5/1995 | Romesburg et al. | |
| 5,457,620 A | 10/1995 | Dromgoole | |
| 5,486,871 A | 1/1996 | Filliman et al. | |
| 5,532,916 A | 7/1996 | Tamagawa | |
| 5,541,547 A | 7/1996 | Lam | |
| 5,581,454 A | 12/1996 | Collins | |
| 5,646,621 A | 7/1997 | Cabler et al. | |
| 5,715,526 A | 2/1998 | Weaver, Jr. et al. | |
| 5,767,744 A | 6/1998 | Irwin et al. | |
| 5,822,318 A | 10/1998 | Tiedemann, Jr. et al. | |
| 5,898,342 A | 4/1999 | Bell | |
| 5,905,407 A | 5/1999 | Midya | |
| 5,936,464 A | 8/1999 | Grondahl | |
| 6,043,610 A | 3/2000 | Buell | |
| 6,043,707 A | 3/2000 | Budnik | |
| 6,055,168 A | 4/2000 | Kotowski et al. | |
| 6,070,181 A | 5/2000 | Yeh | |
| 6,118,343 A | 9/2000 | Winslow et al. | |
| 6,133,777 A | 10/2000 | Savelli | |
| 6,141,541 A | 10/2000 | Midya et al. | |
| 6,147,478 A | 11/2000 | Skelton et al. | |
| 6,166,598 A | 12/2000 | Schlueter | |
| 6,198,645 B1 | 3/2001 | Kotowski et al. | |
| 6,204,731 B1 | 3/2001 | Jiang et al. | |
| 6,256,482 B1 | 7/2001 | Raab | |
| 6,300,826 B1 | 10/2001 | Mathe et al. | |
| 6,313,681 B1 | 11/2001 | Yoshikawa | |
| 6,348,780 B1 | 2/2002 | Grant | |
| 6,400,775 B1 | 6/2002 | Gourgue et al. | |
| 6,483,281 B2 | 11/2002 | Hwang | |
| 6,559,689 B1 | 5/2003 | Clark | |
| 6,566,935 B1 | 5/2003 | Renous | |
| 6,583,610 B2 | 6/2003 | Groom et al. | |
| 6,617,930 B2 | 9/2003 | Nitta | |
| 6,621,808 B1 | 9/2003 | Sadri | |
| 6,624,712 B1 | 9/2003 | Cygan et al. | |
| 6,646,501 B1 | 11/2003 | Wessel | |
| 6,658,445 B1 | 12/2003 | Gau et al. | |
| 6,681,101 B1 | 1/2004 | Eidson et al. | |
| 6,686,727 B2 | 2/2004 | Ledenev et al. | |
| 6,690,652 B1 | 2/2004 | Sadri | |
| 6,701,141 B2 | 3/2004 | Lam | |
| 6,703,080 B2 | 3/2004 | Reyzelman et al. | |
| 6,728,163 B2 | 4/2004 | Gomm et al. | |
| 6,744,151 B2 | 6/2004 | Jackson et al. | |
| 6,819,938 B2 | 11/2004 | Sahota | |
| 6,885,176 B2 | 4/2005 | Librizzi | |
| 6,958,596 B1 | 10/2005 | Sferrazza et al. | |
| 6,995,995 B2 | 2/2006 | Zeng et al. | |
| 7,038,536 B2 | 5/2006 | Cioffi et al. | |
| 7,043,213 B2 | 5/2006 | Robinson et al. | |
| 7,053,718 B2 | 5/2006 | Dupuis et al. | |
| 7,058,373 B2 | 6/2006 | Grigore | |
| 7,099,635 B2 | 8/2006 | McCune | |
| 7,164,893 B2 | 1/2007 | Leizerovich et al. | |
| 7,170,341 B2 | 1/2007 | Conrad et al. | |
| 7,200,365 B2 | 4/2007 | Watanabe et al. | |
| 7,233,130 B1 | 6/2007 | Kay | |
| 7,253,589 B1 | 8/2007 | Potanin et al. | |
| 7,254,157 B1 | 8/2007 | Crotty et al. | |
| 7,262,658 B2 | 8/2007 | Ramaswamy et al. | |
| 7,279,875 B2 | 10/2007 | Gan et al. | |
| 7,304,537 B2 | 12/2007 | Kwon et al. | |
| 7,348,847 B2 | 3/2008 | Whittaker | |
| 7,394,233 B1 | 7/2008 | Trayling et al. | |
| 7,405,618 B2 | 7/2008 | Lee et al. | |
| 7,411,316 B2 | 8/2008 | Pai | |
| 7,414,330 B2 | 8/2008 | Chen | |
| 7,453,711 B2 | 11/2008 | Yanagida et al. | |
| 7,454,238 B2 | 11/2008 | Vinayak et al. | |
| 7,515,885 B2 | 4/2009 | Sander et al. | |
| 7,528,807 B2 | 5/2009 | Kim et al. | |
| 7,529,523 B1 | 5/2009 | Young et al. | |
| 7,539,466 B2 | 5/2009 | Tan et al. | |
| 7,595,569 B2 | 9/2009 | Amerom et al. | |
| 7,609,114 B2 | 10/2009 | Hsieh et al. | |
| 7,615,979 B2 | 11/2009 | Caldwell | |
| 7,627,622 B2 | 12/2009 | Conrad et al. | |
| 7,646,108 B2 | 1/2010 | Paillet et al. | |
| 7,653,366 B2 | 1/2010 | Grigore | |
| 7,679,433 B1 | 3/2010 | Li | |
| 7,684,216 B2 | 3/2010 | Choi et al. | |
| 7,696,735 B2 | 4/2010 | Oraw et al. | |
| 7,715,811 B2 | 5/2010 | Kenington | |
| 7,724,837 B2 | 5/2010 | Filimonov et al. | |
| 7,755,431 B2 | 7/2010 | Sun | |
| 7,764,060 B2 | 7/2010 | Wilson | |
| 7,773,691 B2 | 8/2010 | Khlat et al. | |
| 7,773,965 B1 | 8/2010 | Van Brunt et al. | |
| 7,777,459 B2 | 8/2010 | Williams | |
| 7,782,036 B1 | 8/2010 | Wong et al. | |
| 7,783,269 B2 | 8/2010 | Vinayak et al. | |
| 7,800,427 B2 | 9/2010 | Chae et al. | |
| 7,805,115 B1 | 9/2010 | McMorrow et al. | |
| 7,852,150 B1 * | 12/2010 | Arknaes-Pedersen | H03F 3/217 |
| | | | 330/10 |

(56) References Cited

U.S. PATENT DOCUMENTS

| | | |
|---|---|---|
| 7,856,048 B1 | 12/2010 | Smaini et al. |
| 7,859,336 B2 | 12/2010 | Markowski et al. |
| 7,880,547 B2 | 2/2011 | Lee et al. |
| 7,884,681 B1 | 2/2011 | Khlat et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,917,105 B2 | 3/2011 | Drogi et al. |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,358,113 B2 | 1/2013 | Cheng et al. |
| 8,362,837 B2 | 1/2013 | Koren et al. |
| 8,446,135 B2 | 5/2013 | Chen et al. |
| 8,493,141 B2 | 7/2013 | Khlat et al. |
| 8,519,788 B2 | 8/2013 | Khlat |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,633,766 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,693,676 B2 | 4/2014 | Xiao et al. |
| 8,717,100 B2 | 5/2014 | Reisner et al. |
| 8,718,579 B2 | 5/2014 | Drogi |
| 8,718,582 B2 | 5/2014 | See et al. |
| 8,725,218 B2 | 5/2014 | Brown et al. |
| 8,744,382 B2 | 6/2014 | Hou et al. |
| 8,749,307 B2 | 6/2014 | Zhu et al. |
| 8,760,228 B2 | 6/2014 | Khlat |
| 8,782,107 B2 | 7/2014 | Myara et al. |
| 8,792,840 B2 | 7/2014 | Khlat et al. |
| 8,803,605 B2 | 8/2014 | Fowers et al. |
| 8,824,978 B2 | 9/2014 | Briffa et al. |
| 8,829,993 B2 | 9/2014 | Briffa et al. |
| 8,878,606 B2 | 11/2014 | Khlat et al. |
| 8,884,696 B2 | 11/2014 | Langer |
| 8,909,175 B1 | 12/2014 | McCallister |
| 8,942,313 B2 | 1/2015 | Khlat et al. |
| 8,942,651 B2 | 1/2015 | Jones |
| 8,942,652 B2 | 1/2015 | Khlat et al. |
| 8,947,161 B2 | 2/2015 | Khlat et al. |
| 8,947,162 B2 | 2/2015 | Wimpenny et al. |
| 8,952,710 B2 | 2/2015 | Retz et al. |
| 8,957,728 B2 | 2/2015 | Gorisse |
| 8,975,959 B2 | 3/2015 | Khlat |
| 8,981,839 B2 | 3/2015 | Kay et al. |
| 8,981,847 B2 | 3/2015 | Balteanu |
| 8,981,848 B2 | 3/2015 | Kay et al. |
| 8,994,345 B2 | 3/2015 | Wilson |
| 9,019,011 B2 | 4/2015 | Hietala et al. |
| 9,020,451 B2 | 4/2015 | Khlat |
| 9,024,688 B2 | 5/2015 | Kay et al. |
| 9,041,364 B2 | 5/2015 | Khlat |
| 9,041,365 B2 | 5/2015 | Kay et al. |
| 9,075,673 B2 | 7/2015 | Khlat et al. |
| 9,077,405 B2 | 7/2015 | Jones et al. |
| 9,099,961 B2 | 8/2015 | Kay et al. |
| 9,112,452 B1 | 8/2015 | Khlat |
| 2002/0071497 A1 | 6/2002 | Bengtsson et al. |
| 2002/0125869 A1 | 9/2002 | Groom et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0184713 A1 | 8/2005 | Xu et al. |
| 2005/0200407 A1 | 9/2005 | Arai et al. |
| 2005/0208907 A1 | 9/2005 | Yamazaki et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0147062 A1 | 7/2006 | Niwa et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2006/0270366 A1 | 11/2006 | Rozenblit et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0054635 A1 | 3/2007 | Black et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1* | 7/2007 | Ishikawa ............... H03F 1/0222 330/280 |
| 2007/0182392 A1 | 8/2007 | Nishida |
| 2007/0183532 A1 | 8/2007 | Matero |
| 2007/0184794 A1* | 8/2007 | Drogi .................. H03F 1/0205 455/127.1 |

(56) References Cited

U.S. PATENT DOCUMENTS

| | | | |
|---|---|---|---|
| 2007/0249304 A1* | 10/2007 | Snelgrove | H03F 1/0205 455/127.2 |
| 2007/0259628 A1 | 11/2007 | Carmel et al. | |
| 2007/0290749 A1 | 12/2007 | Woo et al. | |
| 2008/0003950 A1 | 1/2008 | Haapoja et al. | |
| 2008/0044041 A1 | 2/2008 | Tucker et al. | |
| 2008/0081572 A1 | 4/2008 | Rofougaran | |
| 2008/0104432 A1* | 5/2008 | Vinayak | G06F 1/26 713/300 |
| 2008/0150619 A1 | 6/2008 | Lesso et al. | |
| 2008/0157745 A1 | 7/2008 | Nakata | |
| 2008/0205095 A1 | 8/2008 | Pinon et al. | |
| 2008/0224769 A1* | 9/2008 | Markowski | H03F 1/0227 330/10 |
| 2008/0242246 A1 | 10/2008 | Minnis et al. | |
| 2008/0252278 A1 | 10/2008 | Lindeberg et al. | |
| 2008/0258831 A1 | 10/2008 | Kunihiro et al. | |
| 2008/0259656 A1* | 10/2008 | Grant | H02M 3/33523 363/21.18 |
| 2008/0280577 A1 | 11/2008 | Beukema et al. | |
| 2009/0004981 A1 | 1/2009 | Eliezer et al. | |
| 2009/0015229 A1 | 1/2009 | Kotikalapoodi | |
| 2009/0039947 A1 | 2/2009 | Williams | |
| 2009/0045872 A1 | 2/2009 | Kenington | |
| 2009/0082006 A1 | 3/2009 | Pozsgay et al. | |
| 2009/0097591 A1 | 4/2009 | Kim | |
| 2009/0140706 A1 | 6/2009 | Taufik et al. | |
| 2009/0160548 A1* | 6/2009 | Ishikawa | H03F 1/0227 330/136 |
| 2009/0167260 A1 | 7/2009 | Pauritsch et al. | |
| 2009/0174466 A1 | 7/2009 | Hsieh et al. | |
| 2009/0184764 A1 | 7/2009 | Markowski et al. | |
| 2009/0190699 A1 | 7/2009 | Kazakevich et al. | |
| 2009/0191826 A1 | 7/2009 | Takinami et al. | |
| 2009/0218995 A1 | 9/2009 | Ahn | |
| 2009/0230934 A1 | 9/2009 | Hooijschuur et al. | |
| 2009/0261908 A1* | 10/2009 | Markowski | H03F 1/0205 330/298 |
| 2009/0284235 A1 | 11/2009 | Weng et al. | |
| 2009/0289720 A1 | 11/2009 | Takinami et al. | |
| 2009/0319065 A1 | 12/2009 | Risbo | |
| 2010/0001793 A1 | 1/2010 | Van Zeijl et al. | |
| 2010/0002473 A1 | 1/2010 | Williams | |
| 2010/0019749 A1 | 1/2010 | Katsuya et al. | |
| 2010/0019840 A1 | 1/2010 | Takahashi | |
| 2010/0026250 A1 | 2/2010 | Petty | |
| 2010/0027301 A1 | 2/2010 | Hoyerby | |
| 2010/0045247 A1 | 2/2010 | Blanken et al. | |
| 2010/0171553 A1 | 7/2010 | Okubo et al. | |
| 2010/0181973 A1 | 7/2010 | Pauritsch et al. | |
| 2010/0253309 A1 | 10/2010 | Xi et al. | |
| 2010/0266066 A1 | 10/2010 | Takahashi | |
| 2010/0289568 A1 | 11/2010 | Eschauzier et al. | |
| 2010/0301947 A1 | 12/2010 | Fujioka et al. | |
| 2010/0308654 A1 | 12/2010 | Chen | |
| 2010/0311365 A1 | 12/2010 | Vinayak et al. | |
| 2010/0321127 A1 | 12/2010 | Watanabe et al. | |
| 2010/0327825 A1 | 12/2010 | Mehas et al. | |
| 2010/0327971 A1 | 12/2010 | Kumagai | |
| 2011/0018626 A1 | 1/2011 | Kojima | |
| 2011/0058601 A1 | 3/2011 | Kim et al. | |
| 2011/0084756 A1 | 4/2011 | Saman et al. | |
| 2011/0084760 A1 | 4/2011 | Guo et al. | |
| 2011/0109387 A1 | 5/2011 | Lee | |
| 2011/0148375 A1 | 6/2011 | Tsuji | |
| 2011/0193629 A1 | 8/2011 | Hou et al. | |
| 2011/0234182 A1 | 9/2011 | Wilson | |
| 2011/0235827 A1 | 9/2011 | Lesso et al. | |
| 2011/0260706 A1 | 10/2011 | Nishijima | |
| 2011/0279180 A1 | 11/2011 | Yamanouchi et al. | |
| 2011/0298433 A1 | 12/2011 | Tam | |
| 2011/0298539 A1 | 12/2011 | Drogi et al. | |
| 2011/0304400 A1 | 12/2011 | Stanley | |
| 2012/0025907 A1 | 2/2012 | Koo et al. | |
| 2012/0025919 A1 | 2/2012 | Huynh | |
| 2012/0032658 A1 | 2/2012 | Casey et al. | |
| 2012/0034893 A1 | 2/2012 | Baxter et al. | |
| 2012/0049894 A1 | 3/2012 | Berchtold et al. | |
| 2012/0049953 A1 | 3/2012 | Khlat | |
| 2012/0068767 A1 | 3/2012 | Henshaw et al. | |
| 2012/0074916 A1 | 3/2012 | Trochut | |
| 2012/0098595 A1 | 4/2012 | Stockert | |
| 2012/0119813 A1 | 5/2012 | Khlat et al. | |
| 2012/0133299 A1 | 5/2012 | Capodivacca et al. | |
| 2012/0139516 A1 | 6/2012 | Tsai et al. | |
| 2012/0154035 A1 | 6/2012 | Hongo et al. | |
| 2012/0154054 A1 | 6/2012 | Kaczman et al. | |
| 2012/0170334 A1 | 7/2012 | Menegoli et al. | |
| 2012/0170690 A1 | 7/2012 | Ngo et al. | |
| 2012/0176196 A1 | 7/2012 | Khlat | |
| 2012/0194274 A1 | 8/2012 | Fowers et al. | |
| 2012/0200354 A1 | 8/2012 | Ripley et al. | |
| 2012/0212197 A1 | 8/2012 | Fayed et al. | |
| 2012/0236444 A1 | 9/2012 | Srivastava et al. | |
| 2012/0244916 A1 | 9/2012 | Brown et al. | |
| 2012/0269240 A1 | 10/2012 | Balteanu et al. | |
| 2012/0274235 A1 | 11/2012 | Lee et al. | |
| 2012/0299647 A1 | 11/2012 | Honjo et al. | |
| 2012/0313701 A1 | 12/2012 | Khlat et al. | |
| 2013/0024142 A1 | 1/2013 | Folkmann et al. | |
| 2013/0034139 A1 | 2/2013 | Khlat et al. | |
| 2013/0038305 A1 | 2/2013 | Arno et al. | |
| 2013/0094553 A1 | 4/2013 | Paek et al. | |
| 2013/0106378 A1 | 5/2013 | Khlat | |
| 2013/0107769 A1 | 5/2013 | Khlat et al. | |
| 2013/0134956 A1 | 5/2013 | Khlat | |
| 2013/0135043 A1 | 5/2013 | Hietala et al. | |
| 2013/0141064 A1 | 6/2013 | Kay et al. | |
| 2013/0141068 A1 | 6/2013 | Kay et al. | |
| 2013/0141072 A1 | 6/2013 | Khlat et al. | |
| 2013/0141169 A1 | 6/2013 | Khlat et al. | |
| 2013/0147445 A1 | 6/2013 | Levesque et al. | |
| 2013/0154729 A1 | 6/2013 | Folkmann et al. | |
| 2013/0169245 A1 | 7/2013 | Kay et al. | |
| 2013/0181521 A1 | 7/2013 | Khlat | |
| 2013/0214858 A1 | 8/2013 | Tournatory et al. | |
| 2013/0229235 A1 | 9/2013 | Ohnishi | |
| 2013/0238913 A1 | 9/2013 | Huang et al. | |
| 2013/0271221 A1 | 10/2013 | Levesque et al. | |
| 2013/0307617 A1 | 11/2013 | Khlat et al. | |
| 2013/0328613 A1 | 12/2013 | Kay et al. | |
| 2014/0009200 A1 | 1/2014 | Kay et al. | |
| 2014/0009227 A1 | 1/2014 | Kay et al. | |
| 2014/0028370 A1 | 1/2014 | Wimpenny | |
| 2014/0028392 A1 | 1/2014 | Wimpenny | |
| 2014/0042999 A1 | 2/2014 | Barth et al. | |
| 2014/0049321 A1 | 2/2014 | Gebeyehu et al. | |
| 2014/0055197 A1 | 2/2014 | Khlat et al. | |
| 2014/0057684 A1 | 2/2014 | Khlat | |
| 2014/0062590 A1 | 3/2014 | Khlat et al. | |
| 2014/0077787 A1 | 3/2014 | Gorisse et al. | |
| 2014/0099906 A1 | 4/2014 | Khlat | |
| 2014/0099907 A1 | 4/2014 | Chiron | |
| 2014/0103995 A1 | 4/2014 | Langer | |
| 2014/0111178 A1 | 4/2014 | Khlat et al. | |
| 2014/0125408 A1 | 5/2014 | Kay et al. | |
| 2014/0139199 A1 | 5/2014 | Khlat et al. | |
| 2014/0184335 A1 | 7/2014 | Nobbe et al. | |
| 2014/0203868 A1 | 7/2014 | Khlat et al. | |
| 2014/0203869 A1 | 7/2014 | Khlat et al. | |
| 2014/0225674 A1 | 8/2014 | Folkmann et al. | |
| 2014/0266427 A1 | 9/2014 | Chiron | |
| 2014/0266428 A1 | 9/2014 | Chiron et al. | |
| 2014/0285164 A1 | 9/2014 | Oishi et al. | |
| 2014/0306769 A1 | 10/2014 | Khlat et al. | |
| 2015/0048891 A1 | 2/2015 | Rozek et al. | |
| 2015/0180422 A1 | 6/2015 | Khlat et al. | |
| 2015/0234402 A1 | 8/2015 | Kay et al. | |

FOREIGN PATENT DOCUMENTS

| | | |
|---|---|---|
| CN | 1518209 A | 8/2004 |
| CN | 1898860 A | 1/2007 |
| CN | 101106357 A | 1/2008 |

(56) References Cited

FOREIGN PATENT DOCUMENTS

| | | |
|---|---|---|
| CN | 101201891 A | 6/2008 |
| CN | 101379695 A | 3/2009 |
| CN | 101405671 A | 4/2009 |
| CN | 101416385 A | 4/2009 |
| CN | 101427459 A | 5/2009 |
| CN | 101548476 A | 9/2009 |
| CN | 101626355 A | 1/2010 |
| CN | 101635697 A | 1/2010 |
| CN | 101669280 A | 3/2010 |
| CN | 101867284 A | 10/2010 |
| CN | 201674399 U | 12/2010 |
| EP | 0755121 A2 | 1/1997 |
| EP | 1047188 A2 | 10/2000 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| JP | 2010166157 A | 7/2010 |
| TW | 461168 B | 10/2001 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

First Office Action for Chinese Patent Application No. 2011800302735, issued Dec. 3, 2014, 15 pages (with English translation).
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
International Preliminary Report on Patentability for PCT/US2013/052277, mailed Feb. 5, 2015, 9 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
European Search Report for European Patent Application No. 14190851.7, issued Mar. 5, 2015, 6 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
European Examination Report for European Patent Application No. 14162682.0, mailed May 22, 2015, 5 pages.
Corrected Notice of Allowance for U.S. Appl. No. 13/297,470, mailed Jun. 5, 2015, 11 pages.
Advisory Action for U.S. Appl. No. 13/689,883, mailed Apr. 20, 2015, 3 pages.
Advisory Action for U.S. Appl. No. 13/661,227, mailed May 12, 2015, 3 pages.
Advisory Action for U.S. Appl. No. 13/714,600, mailed May 26, 2015, 3 pages.
Notice of Allowance for U.S. Appl. No. 13/747,725, mailed May 13, 2015, 9 pages.
Notice of Allowance for U.S. Appl. No. 13/747,749, mailed Jun. 4, 2015, 8 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
International Preliminary Report on Patentability for PCT/US2013/065403, mailed Apr. 30, 2015, 8 pages.
Quayle Action for U.S. Appl. No. 13/689,940, mailed May 14, 2015, 7 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
First Office Action for Chinese Patent Application No. 201280052694.2, issued Mar. 24, 2015, 35 pages.
Notice of Allowance for U.S. Appl. No. 13/948,291, mailed Jul. 17, 2015, 8 pages.
Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.
First Office Action and Search Report for Chinese Patent Application No. 201280007941.7, issued May 13, 2015, 13 pages.
Notice of Allowance for U.S. Appl. No. 14/072,120, mailed Jul. 30, 2015, 7 pages.
Notice of Allowance for U.S. Appl. No. 13/689,940, mailed Aug. 3, 2015, 6 pages.
Yun, Hu et al., "Study of envelope tracking power amplifier design," Journal of Circuits and Systems, vol. 15, No. 6, Dec. 2010, pp. 6-10.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html?cmp_ids=71&news_ids=222901746.

(56) References Cited

OTHER PUBLICATIONS

Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.

Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.

Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.

Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.

Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.

Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.

Le, Hanh-Phuc et al., "A 32nm Fully Integrated Reconfigurable Switched-Capacitor DC-DC Convertor Delivering $0.55W/mm^2$ at 81% Efficiency," 2010 IEEE International Solid State Circuits Conference, Feb. 7-11, 2010, pp. 210-212.

Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.

Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.

Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.

Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.

Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.

Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.

Non-final Office Action for U.S. Appl. No. 11/113,873, now U.S. Pat. No. 7,773,691, mailed Feb. 1, 2008, 17 pages.

Final Office Action for US patent application U.S. Appl. No. 11/113,873, now U.S. Pat. No. 7,773,691, mailed Jul. 30, 2008, 19 pages.

Non-final Office Action for U.S. Appl. No. 11/113,873, now U.S. Pat. No. 7,773,691, mailed Nov. 26, 2008, 22 pages.

Final Office Action for U.S. Appl. No. 11/113,873, now U.S. Pat. No. 7,773,691, mailed May 4, 2009, 20 pages.

Non-final Office Action for U.S. Appl. No. 11/113,873, now U.S. Pat. No. 7,773,691, mailed Feb. 3, 2010, 21 pages.

Notice of Allowance for U.S. Appl. No. 11/113,873, now U.S. Pat. No. 7,773,691, mailed Jun. 9, 2010, 7 pages.

International Search Report for PCT/US06/12619, mailed May 8, 2007, 2 pages.

Extended European Search Report for application 06740532.4, mailed Dec. 7, 2010, 7 pages.

Non-final Office Action for U.S. Appl. No. 12/112,006, mailed Apr. 5, 2010, 6 pages.

Notice of Allowance for U.S. Appl. No. 12/112,006, mailed Jul. 19, 2010, 6 pages.

Non-Final Office Action for U.S. Appl. No. 12/836,307, mailed Nov. 5, 2013, 6 pages.

Notice of Allowance for U.S. Appl. No. 12/836,307, mailed May 5, 2014, 6 pages.

Non-final Office Action for U.S. Appl. No. 13/089,917, mailed Nov. 23, 2012, 6 pages.

Examination Report for European Patent Application No. 11720630, mailed Aug. 16, 2013, 5 pages.

Examination Report for European Patent Application No. 11720630.0, issued Mar. 18, 2014, 4 pages.

European Search Report for European Patent Application No. 14162682.0, issued Aug. 27, 2014, 7 pages.

International Search Report for PCT/US11/033037, mailed Aug. 9, 2011, 10 pages.

International Preliminary Report on Patentability for PCT/US2011/033037, mailed Nov. 1, 2012, 7 pages.

Non-Final Office Action for U.S. Appl. No. 13/188,024, mailed Feb. 5, 2013, 8 pages.

Notice of Allowance for U.S. Appl. No. 13/188,024, mailed Jun. 18, 2013, 8 pages.

International Search Report for PCT/US2011/044857, mailed Oct. 24, 2011, 10 pages.

International Preliminary Report on Patentability for PCT/US2011/044857, mailed Mar. 7, 2013, 6 pages.

Non-final Office Action for U.S. Appl. No. 13/218,400, mailed Nov. 8, 2012, 7 pages.

Notice of Allowance for U.S. Appl. No. 13/218,400, mailed Apr. 11, 2013, 7 pages.

International Search Report for PCT/US11/49243, mailed Dec. 22, 2011, 9 pages.

International Preliminary Report on Patentability for PCT/US11/49243, mailed Nov. 13, 2012, 33 pages.

International Search Report for PCT/US2011/054106, mailed Feb. 9, 2012, 11 pages.

International Preliminary Report on Patentability for PCT/US2011/054106, mailed Apr. 11, 2013, 8 pages.

Notice of Allowance for U.S. Appl. No. 13/297,490, mailed Feb. 27, 2014, 7 pages.

Invitation to Pay Additional Fees for PCT/US2011/061007, mailed Feb. 13, 2012, 7 pages.

International Search Report for PCT/US2011/061007, mailed Aug. 16, 2012, 16 pages.

International Preliminary Report on Patentability for PCT/US2011/061007, mailed May 30, 2013, 11 pages.

Non-Final Office Action for U.S. Appl. No. 13/297,470, mailed May 8, 2013, 15 pages.

Final Office Action for U.S. Appl. No. 13/297,470, mailed Oct. 25, 2013, 17 pages.

Non-Final Office Action for U.S. Appl. No. 13/297,470, mailed Feb. 20, 2014, 16 pages.

International Search Report for PCT/US2011/061009, mailed Feb. 8, 2012, 14 pages.

International Preliminary Report on Patentability for PCT/US2011/061009, mailed May 30, 2013, 10 pages.

Notice of Allowance for U.S. Appl. No. 14/022,858, mailed Oct. 25, 2013, 9 pages.

Notice of Allowance for U.S. Appl. No. 14/022,858, mailed May 27, 2014, 6 pages.

Notice of Allowance for U.S. Appl. No. 13/343,840, mailed Jul. 1, 2013, 8 pages.

International Search Report for PCT/US2012/023495, mailed May 7, 2012, 13 pages.

(56) References Cited

OTHER PUBLICATIONS

International Preliminary Report on Patentability for PCT/US2012/023495, mailed Aug. 15, 2013, 10 pages.
Notice of Allowance for U.S. Appl. No. 13/363,888, mailed Jul. 18, 2013, 9 pages.
Non-final Office Action for U.S. Appl. No. 13/222,453, mailed Dec. 6, 2012, 13 pages.
Notice of Allowance for U.S. Appl. No. 13/222,453, mailed Feb. 21, 2013, 7 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Non-Final Office Action for U.S. Appl. No. 13/367,973, mailed Apr. 25, 2014, 5 pages.
Invitation to Pay Additional Fees and Where Applicable Protest Fee for PCT/US2012/024124, mailed Jun. 1, 2012, 7 pages.
International Search Report for PCT/US2012/024124, mailed Aug. 24, 2012, 14 pages.
International Preliminary Report on Patentability for PCT/US2012/024124, mailed Aug. 22, 2013, 8 pages.
Non-Final Office Action for U.S. Appl. No. 13/423,649, mailed May 22, 2013, 7 pages.
Notice of Allowance for U.S. Appl. No. 13/423,649, mailed Aug. 30, 2013, 8 pages.
Notice of Allowance for U.S. Appl. No. 14/072,140, mailed Aug. 27, 2014, 8 pages.
Notice of Allowance for U.S. Appl. No. 13/316,229, mailed Nov. 14, 2012, 9 pages.
Notice of Allowance for U.S. Appl. No. 13/316,229, mailed Aug. 29, 2013, 8 pages.
International Search Report for PCT/US2011/064255, mailed Apr. 3, 2012, 12 pages.
International Preliminary Report on Patentability for PCT/US2011/064255, mailed Jun. 20, 2013, 7 pages.
Non-Final Office Action for U.S. Appl. No. 14/072,225, mailed Aug. 15, 2014, 4 pages.
International Search Report for PCT/US2012/40317, mailed Sep. 7, 2012, 7 pages.
International Preliminary Report on Patentability for PCT/US2012/040317, mailed Dec. 12, 2013, 5 pages.
Non-Final Office Action for U.S. Appl. No. 13/486,012, mailed Jul. 28, 2014, 7 pages.
Quayle Action for U.S. Appl. No. 13/531,719, mailed Oct. 10, 2013, 5 pages.
Notice of Allowance for U.S. Appl. No. 13/531,719, mailed Dec. 30, 2013, 7 pages.
Notice of Allowance for U.S. Appl. No. 13/548,283, mailed Sep. 3, 2014, 7 pages.
Non-Final Office Action for U.S. Appl. No. 13/550,049, mailed Nov. 25, 2013, 6 pages.
Notice of Allowance for U.S. Appl. No. 13/550,049, mailed Mar. 6, 2014, 5 pages.
International Search Report for PCT/US2012/046887, mailed Dec. 21, 2012, 12 pages.
International Preliminary Report on Patentability for PCT/US2012/046887, mailed Jan. 30, 2014, 8 pages.
Notice of Allowance for U.S. Appl. No. 13/550,060, mailed Aug. 16, 2013, 8 pages.
Non-final Office Action for U.S. Appl. No. 13/222,484, mailed Nov. 8, 2012, 9 pages.
Final Office Action for U.S. Appl. No. 13/222,484, mailed Apr. 10, 2013, 10 pages.
Advisory Action for U.S. Appl. No. 13/222,484, mailed Jun. 14, 2013, 3 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Search Report and Written Opinion for PCT/US2012/053654, mailed Feb. 15, 2013, 11 pages.
International Preliminary Report on Patentability for PCT/US2012/053654, mailed Mar. 13, 2014, 7 pages.
Non-Final Office Action for U.S. Appl. No. 13/647,815, mailed May 2, 2014, 6 pages.
Non-Final Office Action for U.S. Appl. No. 13/689,883, mailed Mar. 27, 2014, 13 pages.
Non-Final Office Action for U.S. Appl. No. 13/689,883, mailed Aug. 27, 2014, 12 pages.
International Search Report and Written Opinion for PCT/US2012/062070, mailed Jan. 21, 2013, 12 pages.
International Preliminary Report on Patentability for PCT/US2012/062070, mailed May 8, 2014, 8 pages.
Non-Final Office Action for U.S. Appl. No. 13/661,552, mailed Feb. 21, 2014, 5 pages.
Notice of Allowance for U.S. Appl. No. 13/661,552, mailed Jun. 13, 2014, 5 pages.
International Search Report and Written Opinion for PCT/US2012/062110, issued Apr. 8, 2014, 12 pages.
International Preliminary Report on Patentability for PCT/US2012/062110, mailed May 8, 2014, 9 pages.
Non-Final Office Action for U.S. Appl. No. 13/692,084, mailed Apr. 10, 2014, 6 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
International Search Report and Written Opinion for PCT/US2012/067230, mailed Feb. 21, 2013, 10 pages.
International Preliminary Report on Patentability and Written Opinion for PCT/US2012/067230, mailed Jun. 12, 2014, 7 pages.
Non-Final Office Action for U.S. Appl. No. 13/684,826, mailed Apr. 3, 2014, 5 pages.
Notice of Allowance for U.S. Appl. No. 13/684,826, mailed Jul. 18, 2014, 7 pages.
Non-Final Office Action for U.S. Appl. No. 14/022,940, mailed Dec. 20, 2013, 5 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/782,142, mailed Sep. 4, 2014, 6 pages.
Non-Final Office Action for U.S. Appl. No. 13/951,976, mailed Apr. 4, 2014, 7 pages.
International Search Report and Written Opinion for PCT/US2013/052277, mailed Jan. 7, 2014, 14 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Extended European Search Report for European Patent Application No. 12794149.0, issued Oct. 29, 2014, 6 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.

(56) References Cited

OTHER PUBLICATIONS

Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Notice of Allowance for U.S. Appl. No. 14/072,140, mailed Dec. 2, 2014, 8 pages.
First Office Action for Chinese Patent Application No. 2012800265590, issued Nov. 3, 2014, 14 pages (with English translation).
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Second Office Action for Chinese Patent Application No. 201180030273.5, issued Aug. 14, 2015, 8 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.
First Office Action for Chinese Patent Application No. 201180067293.X, mailed Aug. 6, 2015, 13 pages.
Author Unknown, "Automatically," Definition, Dictionary.com Unabridged, 2015, pp. 1-6, http://dictionary.reference.com/browse/automatically.
Final Office Action for U.S. Appl. No. 13/689,883, mailed Dec. 23, 2015, 12 pages.
Final Office Action for U.S. Appl. No. 13/714,600, mailed Dec. 24, 2015, 15 pages.
Notice of Allowance for U.S. Appl. No. 13/747,725, mailed Oct. 28, 2015, 9 pages.
Advisory Action for U.S. Appl. No. 13/689,922, mailed Dec. 18, 2015, 3 pages.
Notice of Allowance for U.S. Appl. No. 13/727,911, mailed Nov. 10, 2015, 8 pages.
Notice of Allowance for U.S. Appl. No. 14/163,229, mailed Nov. 5, 2015, 8 pages.
Final Office Action for U.S. Appl. No. 14/163,256, mailed Nov. 2, 2015, 10 pages.
Corrected Notice of Allowability for U.S. Appl. No. 13/689,940, mailed Nov. 17, 2015, 4 pages.
Final Office Action for U.S. Appl. No. 14/082,629, mailed Nov. 4, 2015, 17 pages.
Non-Final Office Action for U.S. Appl. No. 14/458,341, mailed Nov. 12, 2015, 5 pages.
First Office Action for Chinese Patent Application No. 201280042523.1, issued Dec. 4, 2015, 12 pages.
Notice of Allowance for U.S. Appl. No. 14/072,225, mailed Feb. 3, 2016, 7 pages.
Final Office Action for U.S. Appl. No. 13/661,227, mailed Feb. 9, 2016, 28 pages.
Advisory Action for U.S. Appl. No. 14/082,629, mailed Jan. 22, 2016, 3 pages.
Non-Final Office Action for U.S. Appl. No. 13/876,518, mailed Jan. 20, 2016, 16 pages.
Notice of Allowance for U.S. Appl. No. 14/163,256, mailed Feb. 10, 2016, 8 pages.
Notice of Allowance for U.S. Appl. No. 14/072,140, mailed Aug. 20, 2015, 6 pages.
Non-Final Office Action for U.S. Appl. No. 14/072,225, mailed Aug. 18, 2015, 4 pages.
Notice of Allowance for U.S. Appl. No. 13/747,725, mailed Sep. 1, 2015, 9 pages.
Notice of Allowance for U.S. Appl. No. 14/027,416, mailed Aug. 11, 2015, 9 pages.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.
Notice of Allowance for U.S. Appl. No. 13/747,749, mailed Oct. 2, 2015, 8 pages.
Notice of Allowance for U.S. Appl. No. 13/552,768, mailed Sep. 22, 2015, 9 pages.
Final Office Action for U.S. Appl. No. 13/689,922, mailed Oct. 6, 2015, 20 pages.
Notice of Allowance for U.S. Appl. No. 13/727,911, mailed Sep. 14, 2015, 8 pages.
Notice of Allowance for U.S. Appl. No. 13/689,940, mailed Sep. 16, 2015, 7 pages.
Non-Final Office Action for U.S. Appl. No. 14/702,192, mailed Oct. 7, 2015, 7 pages.
Notice of Allowance for U.S. Appl. No. 13/661,164, mailed Oct. 21, 2015, 7 pages.
Non-Final Office Action for U.S. Appl. No. 14/254,215, mailed Oct. 15, 2015, 5 pages.
First Office Action for Chinese Patent Application No. 201280052739.6, mailed Mar. 3, 2016, 31 pages.
Communication under Rule 164(2)(a) EPC for European Patent Application No. 12725911.7, mailed Feb. 17, 2016, 8 pages.
Advisory Action for U.S. Appl. No. 13/689,883, mailed Mar. 4, 2016, 3 pages.
Advisory Action for U.S. Appl. No. 13/714,600, mailed Mar. 14, 2016, 3 pages.
Notice of Allowance for U.S. Appl. No. 13/689,922, mailed Mar. 18, 2016, 9 pages.
Notice of Allowance for U.S. Appl. No. 14/151,167, mailed Mar. 4, 2016, 7 pages.
Non-Final Office Action for U.S. Appl. No. 14/082,629, mailed Mar. 16, 2016, 23 pages.
Notice of Allowance for U.S. Appl. No. 14/702,192, mailed Feb. 22, 2016, 8 pages.
Notice of Allowance for U.S. Appl. No. 14/254,215, mailed Feb. 18, 2016, 7 pages.
Notice of Allowance for U.S. Appl. No. 14/458,341, mailed Feb. 18, 2016, 6 pages.
Non-Final Office Action for U.S. Appl. No. 13/689,883, mailed Apr. 20, 2016, 13 pages.
Notice of Allowance and Examiner Initiated Interview Summary for U.S. Appl. No. 13/661,227, mailed May 13, 2016, 10 pages.
Non-Final Office Action for U.S. Appl. No. 13/714,600, mailed May 4, 2016, 14 pages.
Final Office Action for U.S. Appl. No. 13/876,518, mailed Jun. 2, 2016, 14 pages.
Wang, Feipeng et al., An Improved Power-Added Efficiency 19-dBm Hybrid Envelope Elimination and Restoration Power Amplifier for 802.11g WLAN Applications, IEEE Transactions on Microwave Theory and Techniques, vol. 54, No. 12, Dec. 2006, pp. 4086-4099.
Examination Report for European Patent Application No. 14190851.7, mailed May 2, 2016, 5 pages.
Combined Search and Examination Report for European Patent Application No. 12725911.7, mailed Jun. 15, 2016, 14 pages.

\* cited by examiner

PSEUDO-ENVELOPE FOLLOWING FEEDBACK DELAY COMPENSATION

RELATED APPLICATIONS

The present application claims priority to and is a continuation-in-part of U.S. patent application Ser. No. 13/316,229, filed Dec. 9, 2011, entitled "PSEUDO-ENVELOPE FOLLOWER POWER MANAGEMENT SYSTEM WITH HIGH FREQUENCY RIPPLE CURRENT COMPENSATION," now U.S. Pat. No. 8,633,766, which claims priority to U.S. Provisional Patent Applications No. 61/421,348, filed Dec. 9, 2010; No. 61/421,475, filed Dec. 9, 2010; and No. 61/469,276, filed Mar. 30, 2011.

U.S. patent application Ser. No. 13/316,229, filed Dec. 9, 2011, claims priority to and is a continuation-in-part of U.S. patent application Ser. No. 13/089,917, filed Apr. 19, 2011, entitled "PSEUDO-ENVELOPE FOLLOWING POWER MANAGEMENT SYSTEM," now U.S. Pat. No. 8,493,141, which claims priority to U.S. Provisional Patent Application No. 61/325,659, filed Apr. 19, 2010.

U.S. patent application Ser. No. 13/316,229, filed Dec. 9, 2011, claims priority to and is a continuation-in-part of U.S. patent application Ser. No. 13/218,400, filed Aug. 25, 2011, entitled "BOOST CHARGE-PUMP WITH FRACTIONAL RATIO AND OFFSET LOOP FOR SUPPLY MODULATION," now U.S. Pat. No. 8,519,788, which claims priority to U.S. Provisional Patent Application No. 61/376,877, filed Aug. 25, 2010. U.S. patent application Ser. No. 13/218,400 is a continuation-in-part of U.S. patent application Ser. No. 13/089,917, filed Apr. 19, 2011, which claims priority to U.S. Provisional Patent Application No. 61/325,659, filed Apr. 19, 2010.

All of the applications listed above are hereby incorporated herein by reference in their entireties.

FIELD OF THE DISCLOSURE

The embodiments described herein relate to a power management system for delivering current to a linear RF power amplifier. More particularly, the embodiments relate to the use of a pseudo-envelope tracker in a power management system of mobile communications equipment.

BACKGROUND

Next-generation mobile devices are morphing from voice-centric telephones to message and multimedia-based "smart" phones that offer attractive new features. As an example, smart phones offer robust multimedia features such as web-browsing, audio and video playback and streaming, email access and a rich gaming environment. But even as manufacturers race to deliver ever more feature rich mobile devices, the challenge of powering them looms large.

In particular, the impressive growth of high bandwidth applications for radio frequency (RF) hand-held devices has led to increased demand for efficient power saving techniques to increase battery life. Because the power amplifier of the mobile device consumes a large percentage of the overall power budget of the mobile device, various power management systems have been proposed to increase the overall power efficiency of the power amplifier.

As an example, some power management systems may use a $V_{RAMP}$ power control voltage to control the voltage presented on a power amplifier collector of a linear RF power amplifier. As another example, other power management schemes may use a buck converter power supply and a class AB amplifier in tandem to provide power to the linear RF power amplifier.

Even so, there remains a need to further improve the power efficiency of mobile devices to provide extended battery life. As a result, there is a need to improve the power management system of mobile devices.

SUMMARY

A switch mode power supply converter and a feedback delay compensation circuit are disclosed according to one embodiment of the present disclosure. The switch mode power supply converter has a switching voltage output and provides a switching voltage at the switching voltage output, such that a target voltage for a power amplifier supply voltage at a power amplifier supply output is based on the switching voltage. Further, the switching voltage is based on an early indication of a change of the target voltage. The feedback delay compensation circuit provides the early indication of the change of the target voltage.

A parallel amplifier circuit is further disclosed according to an alternate embodiment of the present disclosure. The parallel amplifier circuit and the switch mode power supply converter operate in tandem to generate the power amplifier supply voltage for a radio frequency power amplifier. The parallel amplifier circuit may regulate the power amplifier supply voltage more accurately than the switch mode power supply converter. However, the switch mode power supply converter may provide power more efficiently than the parallel amplifier circuit. Therefore, in one embodiment of the present disclosure, the parallel amplifier circuit regulates the power amplifier supply voltage based on a difference between a $V_{RAMP}$ signal and the power amplifier supply voltage, and the switch mode power supply converter drives an output current from the parallel amplifier circuit toward zero to maximize efficiency.

Delays in controlling the switch mode power supply converter and delays in sensing the output current from the parallel amplifier circuit may degrade efficiency. The early indication of the change of the target voltage is used to at least partially compensate for such delays. In one embodiment of the present disclosure, a derivative of the $V_{RAMP}$ signal is used to provide the early indication of the change of the target voltage. The derivative of the $V_{RAMP}$ signal may be used to effectively adjust switching thresholds of the switch mode power supply converter. For example, fast changing $V_{RAMP}$ signals may cause switching threshold changes that provide earlier state changes in the switch mode power supply converter and vice versa.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

A switch mode power supply converter and a feedback delay compensation circuit are disclosed according to one embodiment of the present disclosure. The switch mode power supply converter has a switching voltage output and provides a switching voltage at the switching voltage output, such that a target voltage for a power amplifier supply voltage at a power amplifier supply output is based on the switching voltage. Further, the switching voltage is based on an early indication of a change of the target voltage. The feedback delay compensation circuit provides the early indication of the change of the target voltage.

A parallel amplifier circuit is further disclosed according to an alternate embodiment of the present disclosure. The parallel amplifier circuit and the switch mode power supply converter operate in tandem to generate the power amplifier supply voltage for a radio frequency power amplifier. The parallel amplifier circuit may regulate the power amplifier supply voltage more accurately than the switch mode power supply converter. However, the switch mode power supply converter may provide power more efficiently than the parallel amplifier circuit. Therefore, in one embodiment of the present disclosure, the parallel amplifier circuit regulates the power amplifier supply voltage based on a difference between a $V_{RAMP}$ signal and the power amplifier supply voltage, and the switch mode power supply converter drives an output current from the parallel amplifier circuit toward zero to maximize efficiency.

Delays in controlling the switch mode power supply converter and delays in sensing the output current from the parallel amplifier circuit may degrade efficiency. The early indication of the change of the target voltage is used to at least partially compensate for such delays. In one embodiment of the present disclosure, a derivative of the $V_{RAMP}$ signal is used to provide the early indication of the change of the target voltage. The derivative of the $V_{RAMP}$ signal may be used to effectively adjust switching thresholds of the switch mode power supply converter. For example, fast changing $V_{RAMP}$ signals may cause switching threshold changes that provide earlier state changes in the switch mode power supply converter and vice versa.

Figure 1A:
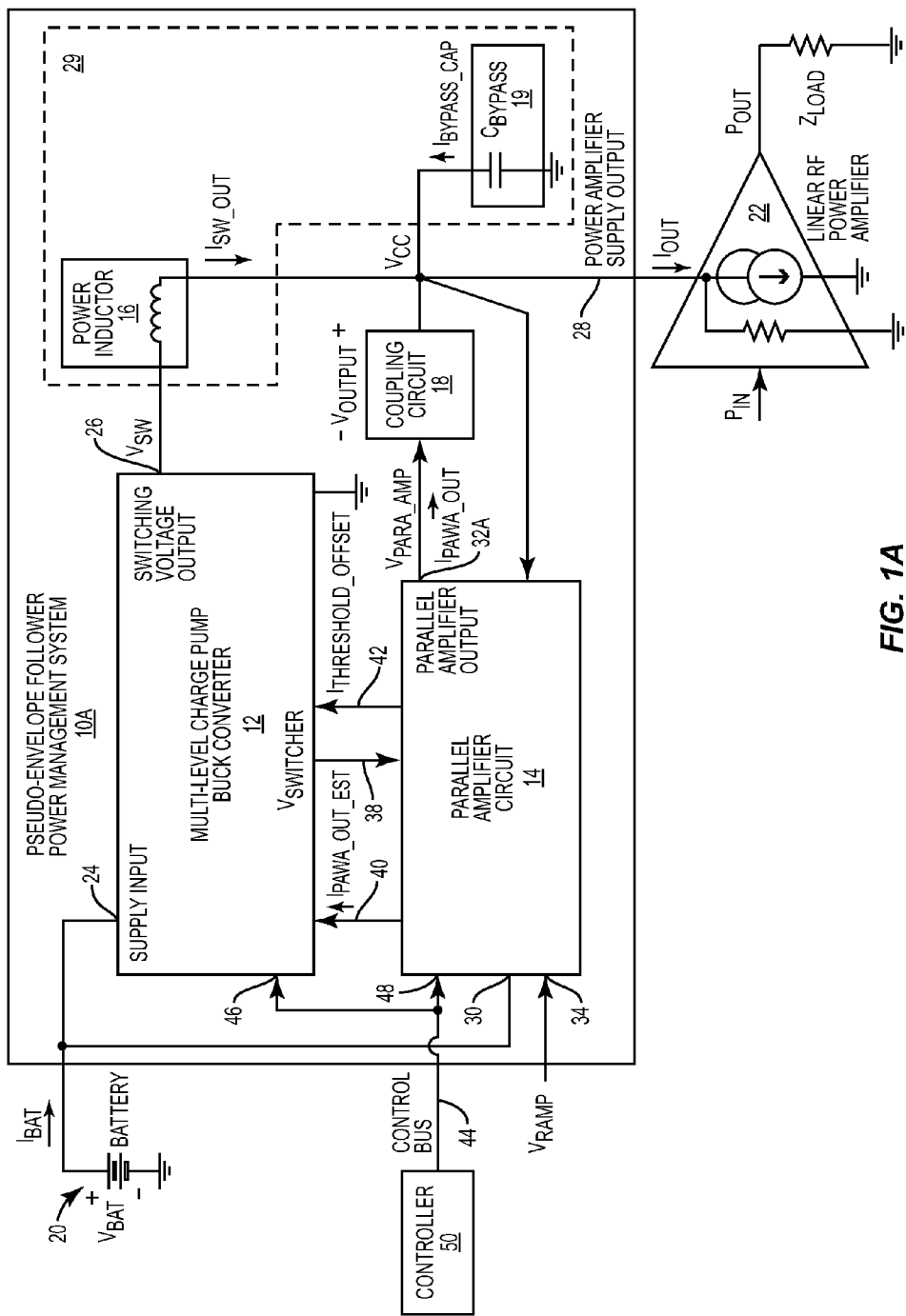
FIG. 1A depicts an embodiment of a pseudo-envelope follower power management system for managing power supplied to a linear RF power amplifier.
Figure 2A:
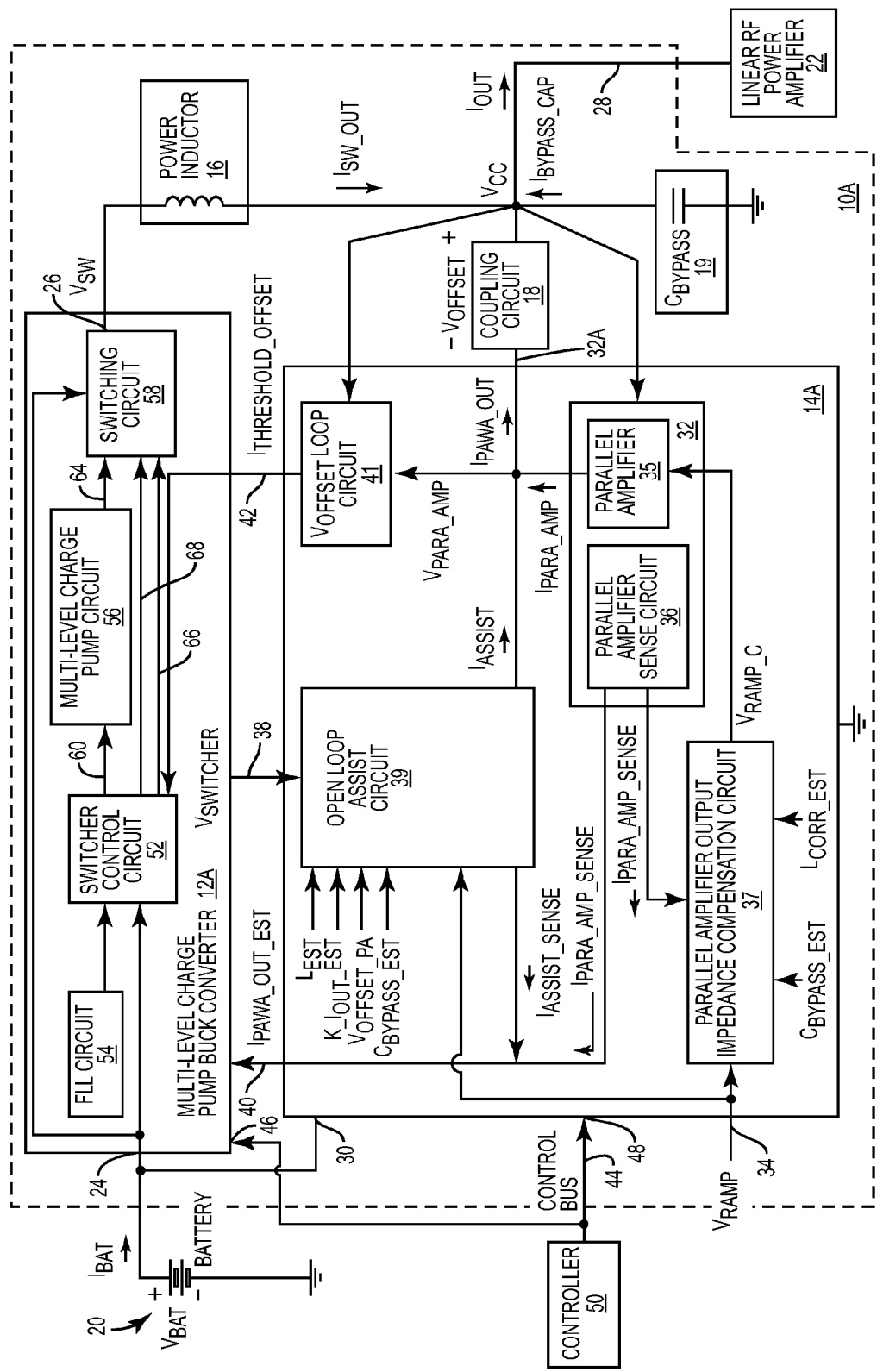
FIG. 2A depicts an embodiment of the pseudo-envelope follower power management system of FIG. 1A in further detail.

FIGS. 1A and 2A depict an example embodiment of a pseudo-envelope follower power management system 10A including a multi-level charge pump buck converter 12, a parallel amplifier circuit 14, a power inductor 16, a coupling circuit 18, and a bypass capacitor 19. In general, the multi-level charge pump buck converter 12 is a switch mode power supply converter. The bypass capacitor 19 has a bypass capacitor capacitance, $C_{BYPASS}$. The multi-level charge pump buck converter 12 and the parallel amplifier circuit 14 may be configured to operate in tandem to generate a power amplifier supply voltage, $V_{CC}$, at a power amplifier supply output 28 of the pseudo-envelope follower power management system 10A for a linear RF power amplifier 22. The power amplifier supply output 28 provides an output current, $I_{OUT}$, to the linear RF power amplifier 22. The linear RF power amplifier 22 may include a power amplifier input, $P_{IN}$, which is configured to receive a modulated RF signal, and a power amplifier output, $P_{OUT}$, coupled to an output load, $Z_{LOAD}$. As an example, the output load, $Z_{LOAD}$, may be an antenna.

The multi-level charge pump buck converter 12 may include a supply input 24, which is configured to receive a direct current (DC) voltage, $V_{BAT}$, from a battery 20, and a switching voltage output 26, which is configured to provide a switching voltage, $V_{SW}$. The switching voltage output 26 may be coupled to the power amplifier supply output 28 by the power inductor 16, where the power inductor 16 couples to the bypass capacitor 19 to form an output filter 29 for the switching voltage output 26 of the multi-level charge pump buck converter 12. The power inductor 16 provides an inductor current, $I_{SW\_OUT}$, to the power amplifier supply output 28. The parallel amplifier circuit 14 may include a parallel amplifier supply input 30, which is configured to receive the DC voltage, $V_{BAT}$, from the battery 20, a parallel amplifier output 32A, a first control input 34, which is configured to receive a $V_{RAMP}$ signal, and a second control input configured to receive the power amplifier supply voltage, $V_{CC}$. The parallel amplifier output 32A of the parallel amplifier circuit 14 may be coupled to the power amplifier supply voltage $V_{CC}$, by the coupling circuit 18. A parallel amplifier output voltage, $V_{PARA\_AMP}$, is provided by the parallel amplifier circuit 14 via the parallel amplifier output 32A.

As an example, the parallel amplifier circuit 14 may generate the parallel amplifier output voltage, $V_{PARA\_AMP}$, based on the difference between the $V_{RAMP}$ signal and the power amplifier supply voltage, $V_{CC}$. Thus, the $V_{RAMP}$ signal may represent either an analog or digital signal that contains the required supply modulation information for a power amplifier collector of the linear RF power amplifier 22. As such, the $V_{RAMP}$ signal is representative of the required supply modulation information for the power amplifier collector of the linear RF power amplifier 22. Typically, the $V_{RAMP}$ signal is provided to the parallel amplifier circuit 14 as a differential analog signal to provide common mode rejection against any noise or spurs that could appear on this signal. The $V_{RAMP}$ signal may be a time domain signal, $V_{RAMP}(t)$, generated by a transceiver or modem and used to transmit radio frequency (RF) signals. For example, the $V_{RAMP}$ signal may be generated by a digital baseband processing portion of the transceiver or modem, where the digital $V_{RAMP}$ signal, $V_{RAMP\_DIGITAL}$, is digitalto-analog converted to form the $V_{RAMP}$ signal in the analog domain. In some embodiments, the "analog" $V_{RAMP}$ signal is a differential signal. The transceiver or a modem may generate the $V_{RAMP}$ signal based upon a known RF modulation Amp(t)*cos(2*pi*$f_{RF}$*t+Phase(t)). The $V_{RAMP}$ signal may represent the target voltage for the power amplifier supply voltage, $V_{CC}$, to be generated at the power amplifier supply output 28 of the pseudo-envelope follower power management system 10A, where the pseudo-envelope follower power management system 10A provides the power amplifier supply voltage, $V_{CC}$, to the linear RF power amplifier 22. Also the $V_{RAMP}$ signal may be generated from a detector coupled to the linear RF power amplifier 22.

For example, the parallel amplifier circuit 14 includes the parallel amplifier output 32A that provides the parallel amplifier output voltage, $V_{PARA\_AMP}$, to the coupling circuit 18. The parallel amplifier output 32A sources a parallel amplifier circuit output current, $I_{PAWA\_OUT}$, to the coupling circuit 18. The parallel amplifier circuit 14, depicted in FIG. 1A and FIG. 1B, may provide a parallel amplifier circuit output current estimate 40, $I_{PAWA\_OUT\_EST}$, to the multi-level charge pump buck converter 12 as an estimate of the parallel amplifier circuit output current $I_{PAWA\_OUT}$, of the parallel amplifier circuit 14. Thus, the parallel amplifier circuit output current estimate 40, $I_{PAWA\_OUT\_EST}$, represents an estimate of the parallel amplifier circuit output current $I_{PAWA\_OUT}$, provided by the parallel amplifier circuit 14 as a feedback signal to the multi-level charge pump buck converter 12. Based on the parallel amplifier circuit output current estimate 40, $I_{PAWA\_OUT\_EST}$, the multi-level charge pump buck converter 12 may be configured to control the switching voltage, $V_{SW}$, provided at the switching voltage output 26 of the multi-level charge pump buck converter 12.

Figure 1B:
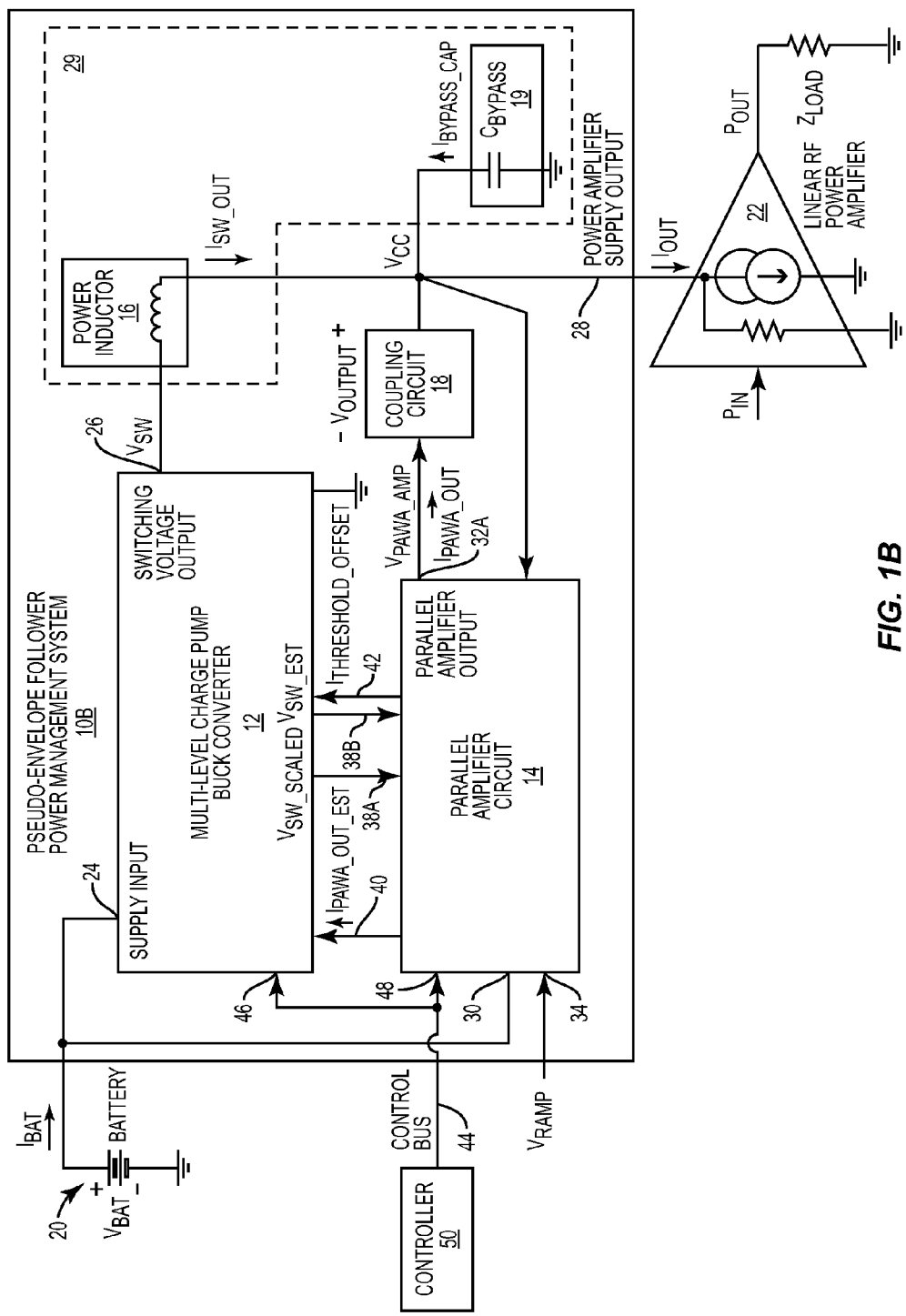
FIG. 1B depicts an embodiment of a pseudo-envelope follower power management system for managing power supplied to a linear RF power amplifier.

In some embodiments of the pseudo-envelope follower power management system 10A, depicted in FIG. 1A, and the pseudo-envelope follower power management system 10B, depicted in FIG. 1B, the coupling circuit 18 may be an offset capacitor, $C_{OFFSET}$. An offset voltage, $V_{OFFSET}$, may be developed across the coupling circuit 18. In other alternative embodiments, the coupling circuit 18 may be a wire trace such that the offset voltage, $V_{OFFSET}$, between the parallel amplifier output voltage, $V_{PARA\_AMP}$, and the power amplifier supply voltage, $V_{CC}$, is zero volts. In still other embodiments, the coupling circuit 18 may be a transformer.

A pseudo-envelope follower power management system 10A, depicted in FIG. 2A, is an example embodiment of the pseudo-envelope follower power management system 10A depicted in FIG. 1A. Unlike the pseudo-envelope follower power management system 10A depicted in FIG. 1A, the pseudo-envelope follower power management system 10A depicted in FIG. 2A includes an embodiment of the multi-level charge pump buck converter 12A and a parallel amplifier circuit 14A having parallel amplifier circuitry 32. The parallel amplifier circuitry 32 includes a parallel amplifier 35 and a parallel amplifier sense circuit 36. The parallel amplifier circuit 14A further includes a parallel amplifier output impedance compensation circuit 37 configured to receive the $V_{RAMP}$ signal and provide a compensated $V_{RAMP}$ signal, $V_{RAMP\_C}$, to an input to the parallel amplifier 35. The compensated $V_{RAMP}$ signal, $V_{RAMP\_C}$, is a function of the $V_{RAMP}$ signal. The parallel amplifier 35 generates a parallel amplifier output current, $I_{PARA\_AMP}$, to produce a parallel amplifier output voltage, $V_{PARA\_AMP}$, at the parallel amplifier output 32A based on the difference between the compensated $V_{RAMP}$ signal, $V_{RAMP\_C}$ and the power amplifier supply voltage, $V_{CC}$, generated at the power amplifier supply output 28. The parallel amplifier sense circuit 36 generates a scaled parallel amplifier output current estimate, $I_{PARA\_AMP\_SENSE}$, which is a fractional representation of the parallel amplifier output current, $I_{PARA\_AMP}$, generated by the parallel amplifier 35. Alternatively, in those embodiments of the parallel amplifier circuit 14 that do not include the parallel amplifier output impedance compensation circuit 37, the parallel amplifier 35 generates the parallel amplifier output current, $I_{PARA\_AMP}$, to produce the parallel amplifier output voltage, $V_{PARA\_AMP}$, based on the difference between the $V_{RAMP}$ signal and the power amplifier supply voltage, $V_{CC}$.

The parallel amplifier circuit 14A may further include an open loop assist circuit 39 configured to receive a feed forward control signal 38, $V_{SWITCHER}$, the scaled parallel amplifier output current estimate, $I_{PARA\_AMP\_SENSE}$, and the $V_{RAMP}$ signal. In response to the feed forward control signal 38, $V_{SWITCHER}$, the scaled parallel amplifier output current estimate, $I_{PARA\_AMP\_SENSE}$, and the $V_{RAMP}$ signal; the open loop assist circuit 39 may be configured to generate an open loop assist current, $I_{ASSIST}$. The open loop assist current, $I_{ASSIST}$, may be provided to the parallel amplifier output 32A. The parallel amplifier output current, $I_{PARA\_AMP}$, generated by the parallel amplifier 35 and the open loop assist circuit current, $I_{ASSIST}$, generated by the open loop assist circuit 39, may be combined to form the parallel amplifier circuit output current, $I_{PAWA\_OUT}$, of the parallel amplifier circuit 14A. The parallel amplifier circuit 14A may further include a $V_{OFFSET}$ loop circuit 41 configured to generate a threshold offset current 42, $I_{THRESHOLD\_OFFSET}$. The threshold offset current 42, $I_{THRESHOLD\_OFFSET}$, may be provided from the parallel amplifier circuit 14A as a feedback signal to the multi-level charge pump buck converter 12A. The $V_{OFFSET}$ loop circuit 41 may be configured to provide a threshold offset current 42, $I_{THRESHOLD\_OFFSET}$, as an estimate of the magnitude of the offset voltage, $V_{OFFSET}$, appearing across the coupling circuit 18. In those cases where the coupling circuit is a wire trace such that the offset voltage, $V_{OFFSET}$, is always zero volts, the parallel amplifier circuit 14A may not provide the threshold offset current 42, $I_{THRESHOLD\_OFFSET}$, to the multi-level charge pump buck converter 12A.

Figure 2B:
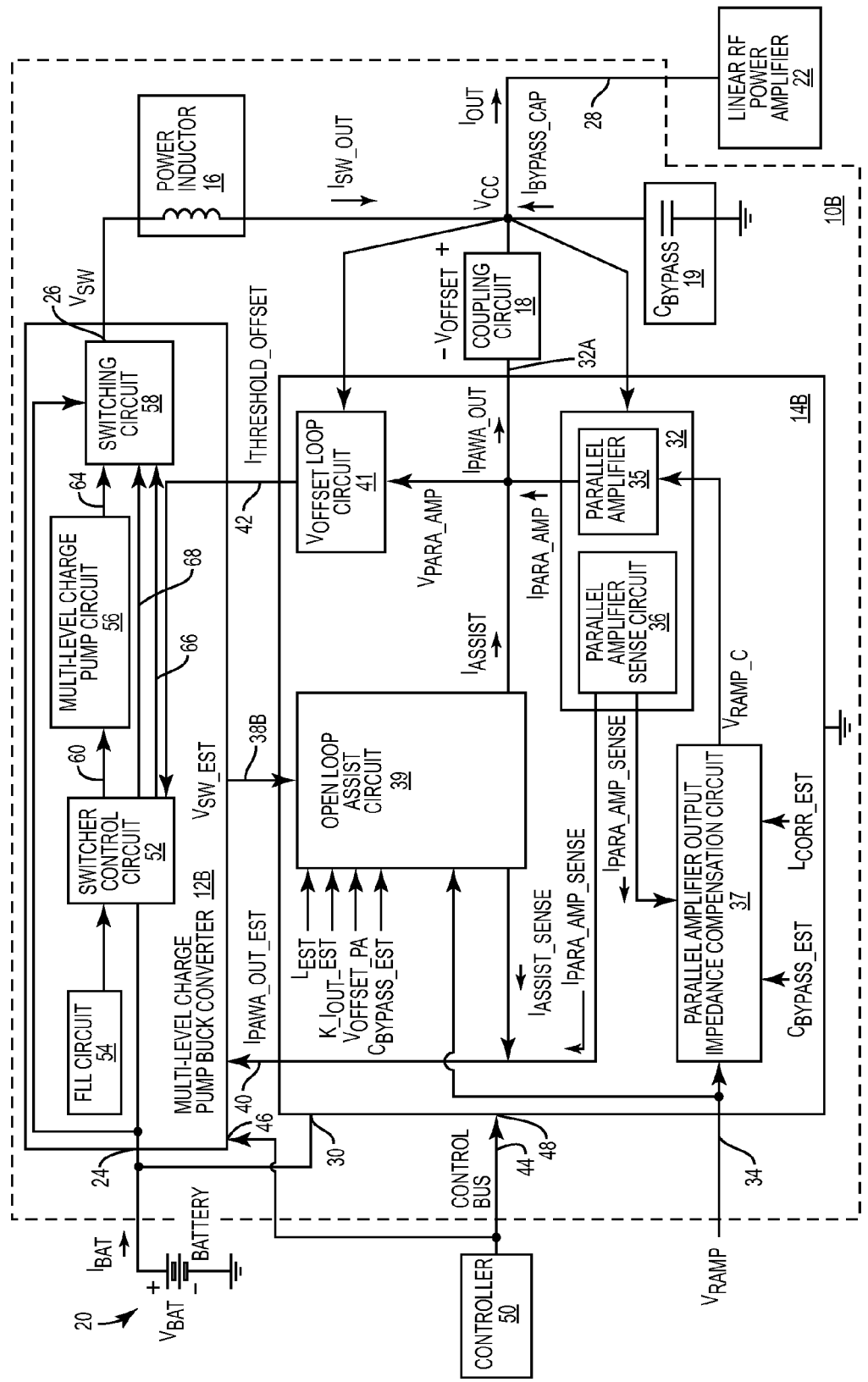
FIG. 2B depicts an embodiment of the pseudo-envelope follower power management system of FIG. 1B in further detail.

Another example is the pseudo-envelope follower power management system 10B depicted in FIG. 2B, which is similar to the embodiment of the pseudo-envelope follower power management system 10B depicted in FIG. 1B. The pseudo-envelope follower power management system 10B is operationally and functionally similar in form and function to the pseudo-envelope follower power management system 10A depicted in FIG. 2A. However, unlike the pseudo-envelope follower power management system 10A depicted in FIG. 2A, the pseudo-envelope follower power management system 10B depicted in FIG. 2B includes a multi-level charge pump buck converter 12B configured to generate an estimated switching voltage output 38B, $V_{SW\_EST}$, and a parallel amplifier circuit 14B configured to receive the estimated switching voltage output 38B, $V_{SW\_EST}$, instead of the feed forward control signal 38, $V_{SWITCHER}$. Consequentially, as depicted in FIG. 2B, the open loop assist circuit 39 of the parallel amplifier circuit 14B is configured to use only the estimated switching voltage output 38B, $V_{SW\_EST}$, instead of the feed forward control signal 38, $V_{SWITCHER}$. The estimated switching voltage output 38B, $V_{SW\_EST}$, provides an indication of the switching voltage, $V_{SW}$.

The generation of the parallel amplifier circuit output current estimate 40, $I_{PAWA\_OUT\_EST}$, depicted in FIGS. 1A and 1B will now be described with continuing reference to the embodiment of the parallel amplifier circuit 14A, depicted in FIG. 2A, and the embodiment of the parallel amplifier circuit 14B depicted in FIG. 2B. Embodiments of the parallel amplifier circuit 14A and the parallel amplifier circuit 14B, depicted in FIGS. 2A and 2B, may provide the parallel amplifier circuit output current estimate 40, $I_{PAWA\_OUT\_EST}$, where the parallel amplifier circuit output current estimate 40, $I_{PAWA\_OUT\_EST}$, includes a scaled parallel amplifier output current estimate, $I_{PARA\_AMP\_SENSE}$, and a scaled open loop assist circuit output current estimate, $I_{ASSIST\_SENSE}$. The scaled parallel amplifier output current estimate, $I_{PARA\_AMP\_SENSE}$, is a scaled estimate of the parallel amplifier output current, $I_{PARA\_AMP}$, generated by the parallel amplifier sense circuit 36 of the parallel amplifier circuitry 32. In some alternative embodiments, the parallel amplifier 35 may generate the scaled estimate of the parallel amplifier output current, $I_{PARA\_AMP\_SENSE}$, directly. The scaled open loop assist circuit current estimate, $I_{ASSIST\_SENSE}$, is a scaled estimate of the open loop assist circuit current, $I_{ASSIST}$, generated by the open loop assist circuit 39. In other alternative embodiments of the parallel amplifier circuit 14 depicted in FIG. 1A and FIG. 1B, the parallel amplifier circuit 14 does not include the open loop assist circuit 39. In those embodiments of the parallel amplifier circuit 14 depicted in FIG. 1A and FIG. 1B that do not include the open loop assist circuit 39, the parallel amplifier circuit output current estimate 40, $I_{PAWA\_OUT\_EST}$, may only be based on the scaled parallel amplifier output current estimate, $I_{PARA\_AMP\_SENSE}$.

Returning to FIGS. 1A and 1B, the pseudo-envelope follower power management systems 10A and 10B may further include a control bus 44 coupled to a controller 50. The control bus 44 may be coupled to a control bus interface 46 of the multi-level charge pump buck converter 12 and a control bus interface 48 of the parallel amplifier circuit 14. The controller 50 may include various logical blocks, modules, and circuits. The controller 50 may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices. As an example, a combination of computing devices may include a combination of a DSP and a microprocessor, a plurality of microprocessors, one or more microprocessors in conjunction with a DSP core, or any other such configuration. The controller may further include or be embodied in hardware and in computer executable instructions that are stored in memory, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. An exemplary storage medium may be coupled to the processor such that a processor can read information from, and write information to, the storage medium. In the alternative, the storage medium or a portion of the storage medium may be integral to the processor. The processor and the storage medium may reside in an ASIC.

FIGS. 2A and 2B depict a pseudo-envelope follower power management system 10A and a pseudo-envelope follower power management system 10B, respectively, that include embodiments of the multi-level charge pump buck converter 12A and the multi-level charge pump buck converter 12B. As depicted in FIGS. 2A and 2B, some embodiments of the multi-level charge pump buck converter 12 of FIGS. 1A and 1B may include an FLL circuit 54 configured to interoperate with a switcher control circuit 52. Alternatively, some embodiments of the multi-level charge pump buck converter 12A and the multi-level charge pump buck converter 12B may not include an FLL circuit 54 or be configured to operate with the FLL circuit 54 being disabled.

As further depicted in FIGS. 2A and 2B, some embodiments of the switcher control circuit 52 may be configured to control the operation of a multi-level charge pump circuit 56 and a switching circuit 58 to generate the switching voltage, $V_{SW}$, on the switching voltage output 26 of the multi-level charge pump buck converter 12A or the multi-level charge pump buck converter 12B, respectively. For example, the switcher control circuit 52 may use a charge pump mode control signal 60 to configure the operation of the multi-level charge pump circuit 56 to provide a charge pump output 64 to the switching circuit 58. Alternatively, the switcher control circuit 52 may generate a series switch control signal 66 to configure the switching circuit 58 to provide the switching voltage, $V_{SW}$, substantially equal to the DC voltage, $V_{BAT}$, from the battery 20 via a first switching element coupled between the supply input 24 and the switching voltage output 26. As another example, the switcher control circuit 52 may configure the switching circuit 58 to provide the switching voltage, $V_{SW}$, through a second switching element coupled to ground such that the switching voltage, $V_{SW}$, is substantially equal to ground.

In addition, the parallel amplifier circuit 14A, depicted in FIG. 2A, and the parallel amplifier circuit 14B, depicted in FIG. 2B, may be configured to provide the parallel amplifier circuit output current estimate 40, $I_{PAWA\_OUT\_EST}$, and the threshold offset current 42, $I_{THRESHOLD\_OFFSET}$, to the switcher control circuit 52 in order to control the operation of the switcher control circuit 52. As discussed in detail below, some embodiments of the switcher control circuit 52 may be configured to receive and use the parallel amplifier circuit output current estimate 40, $I_{PAWA\_OUT\_EST}$, the threshold offset current 42, $I_{THRESHOLD\_OFFSET}$, and/or a combination thereof to control the operation of the switcher control circuit 52.

For example, the switcher control circuit 52 may use the parallel amplifier circuit output current estimate 40, $I_{PAWA\_OUT\_EST}$, the threshold offset current 42, $I_{THRESHOLD\_OFFSET}$, and/or a combination thereof to determine the magnitude of the voltage provided by the switching voltage, $V_{SW}$, from the multi-level charge pump circuit 56.

Figure 3A:
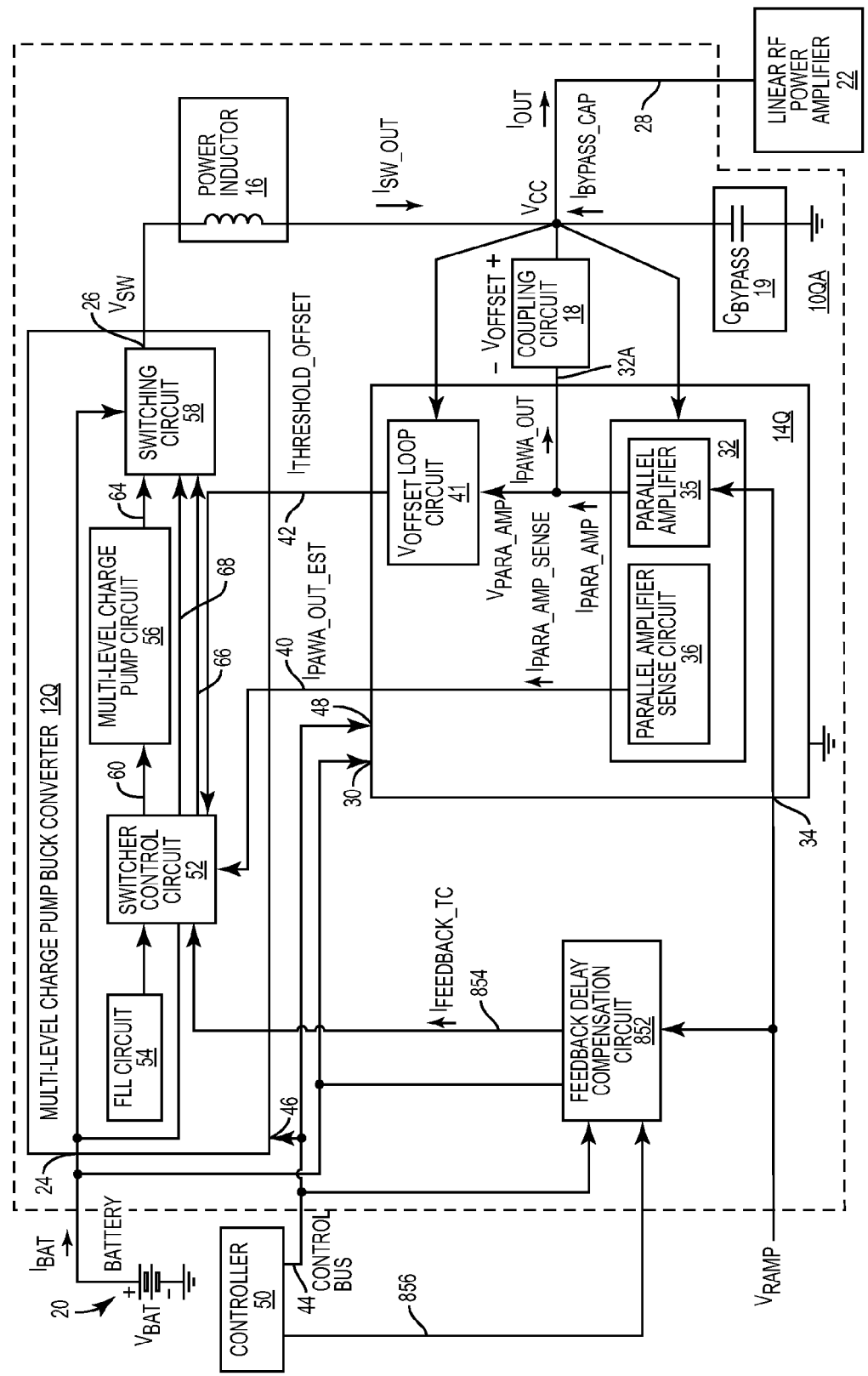
FIG. 3A depicts an example embodiment of a pseudo-envelope follower power management system that includes a feedback delay compensation circuit in combination with a multi-level charge pump buck converter.

FIG. 3A depicts an embodiment of a pseudo-envelope follower power management system 10QA. As a non-limiting example, the pseudo-envelope follower power management system 10QA includes a multi-level charge pump buck converter 12Q, a parallel amplifier circuit 14Q, the power inductor 16, the coupling circuit 18, the bypass capacitor 19, and the power amplifier supply output 28. Similar to the previously described embodiments of the pseudo-envelope follower power management systems, the multi-level charge pump buck converter 12Q and the parallel amplifier circuit 14Q of the embodiment of a pseudo-envelope follower power management system 10QA may be configured to operate in tandem with the power inductor 16, the coupling circuit 18, and the bypass capacitor 19 to generate a power amplifier supply voltage, $V_{CC}$, at the power amplifier supply output 28 of the for a linear RF power amplifier 22. The power inductor 16 is coupled between the switching voltage output 26 and the power amplifier supply output 28. The bypass capacitor 19 is coupled between the power amplifier supply output 28 and ground. In addition, the parallel amplifier circuit 14Q may be coupled to the battery 20 and the controller 50. The parallel amplifier circuit 14Q may include a parallel amplifier output 32A and be configured to receive the power amplifier supply voltage, $V_{CC}$, as a feedback voltage. The coupling circuit 18 may be coupled between the parallel amplifier output 32A and the power amplifier supply output 28. In addition, the parallel amplifier circuit 14Q may be configured to regulate the power amplifier supply voltage, $V_{CC}$, based on the difference between the $V_{RAMP}$ signal and the power amplifier supply voltage, $V_{CC}$. Likewise, as an example, the parallel amplifier circuit 14Q may be configured to provide the parallel amplifier circuit output current estimate 40, $I_{PAWA\_OUT\_EST}$, and the threshold offset current 42, $I_{THRESHOLD\_OFFSET}$, to the multi-level charge pump buck converter 12Q as feedback signals to govern the operation of the multi-level charge pump buck converter 12Q.

As an example, in the pseudo-envelope follower power management system 10QA depicted in FIG. 3A, the parallel amplifier circuit 14Q acts as a master to control the power amplifier supply voltage, $V_{CC}$, at the power amplifier supply output 28 while controlling the multi-level charge pump buck converter 12Q. The parallel amplifier circuit 14Q regulates the power amplifier supply voltage, $V_{CC}$, by sourcing and sinking current through the coupling circuit 18, based on the received $V_{RAMP}$ signal, to compensate for either the over or under generation of the power inductor current, $I_{SW\_OUT}$, provided from the power inductor 16 due to changes in the switching voltage, $V_{SW}$, provided at the switching voltage output 26 of the multi-level charge pump buck converter 12Q. The parallel amplifier circuit 14Q controls the changes in the switching voltage, $V_{SW}$, provided at the switching voltage output 26 based on the parallel amplifier circuit output current estimate 40, $I_{PAWA\_OUT\_EST}$, and the threshold offset current 42, $I_{THRESHOLD\_OFFSET}$, provided to the multi-level charge pump buck converter 12Q as feedback signals. The parallel amplifier circuit 14Q may include a parallel amplifier circuit delay. The parallel amplifier circuit delay is the period of time in the $V_{RAMP}$ processing path between the first control input 34 and the power amplifier supply output 28. As an example, the parallel amplifier circuit delay of the embodiment of the parallel amplifier circuit 14Q depicted in FIG. 3A may include the period of time between the $V_{RAMP}$ signal arriving at the first control input 34 and a change in the value of the power amplifier supply voltage, $V_{CC}$, generated by the parallel amplifier circuit 14Q in response to the $V_{RAMP}$ signal arriving at the first control input 34. The parallel amplifier circuit delay may be due to the internal propagation of the $V_{RAMP}$ signal through the parallel amplifier 35 and/or portions of the parallel amplifier circuitry 32 and pre-processing circuitry. Pre-processing delay associated with pre-processing circuitry may include the propagation delay between the first control input 34 and input of the parallel amplifier 35.

The pseudo-envelope follower power management system 10QA may include delays that can affect the operation of the switcher control circuit 52 and cause increases in the magnitude of the parallel amplifier output current, $I_{PARA\_AMP}$, provided by the parallel amplifier 35. The delays in the pseudo-envelope follower power management system 10QA may result in the parallel amplifier 35 either sourcing or sinking additional current to regulate the power amplifier supply voltage, $V_{CC}$. The increase in magnitude of the parallel amplifier output current, $I_{PARA\_AMP}$, provided by the parallel amplifier 35, may contribute to reduced power efficiency.

As a non-limiting example, in some cases, the delays may be internal to the switcher control circuit 52. In other cases, the delays that reduce the power efficiency of the pseudo-envelope follower power management system 10QA may be related to feedback delays. One example of feedback delay is the time period associated with generation of the scaled parallel amplifier output current estimate, $I_{PARA\_AMP\_SENSE}$, which is also referred to as a parallel amplifier feedback delay. For example, the parallel amplifier circuit 14Q may configure the parallel amplifier sense circuit 36 to generate the scaled parallel amplifier output current estimate, $I_{PARA\_AMP\_SENSE}$. The parallel amplifier circuit 14Q may use the scaled parallel amplifier output current estimate, $I_{PARA\_AMP\_SENSE}$, to provide at least a portion of the parallel amplifier circuit output current estimate 40, $I_{PAWA\_OUT\_EST}$. The parallel amplifier circuit output current estimate 40, $I_{PAWA\_OUT\_EST}$, is provided as a feedback signal to the multi-level charge pump buck converter 12Q such that the parallel amplifier circuit 14Q may control changes in the switching voltage, $V_{SW}$, based on the magnitude of the parallel amplifier circuit output current estimate 40, $I_{PAWA\_OUT\_EST}$, in order to minimize the magnitude of the parallel amplifier output current, $I_{PARA\_AMP}$, provided by the parallel amplifier 35. As such, since a target voltage of the power amplifier supply voltage $V_{CC}$ is based on the parallel amplifier circuit 14Q, the target voltage of the power amplifier supply voltage $V_{CC}$ is further based on the switching voltage, $V_{SW}$. The feedback delay associated with generating and providing the scaled parallel amplifier output current estimate, $I_{PARA\_AMP\_SENSE}$, to the switcher control circuit 52 may delay the response of the multi-level charge pump buck converter 12Q to changes in the $V_{RAMP}$ signal. As a result, the response of the multi-level charge pump buck converter 12Q to a change in the $V_{RAMP}$ signal may be delayed such that the inductor current $I_{SW\_OUT}$ provided from the power inductor 16 may not correlate to the change in the target voltage of the power amplifier supply voltage $V_{CC}$, which is represented by the $V_{RAMP}$ signal. As a result, the parallel amplifier output current, $I_{PARA\_AMP}$, sourced or sunk by the parallel amplifier 35 may be increased due to the feedback delay associated with generation of the scaled parallel amplifier output current estimate, $I_{PARA\_AMP\_SENSE}$, due to the lag in the response time of the multi-level charge pump buck converter 12Q. By minimizing the magnitude of the parallel amplifier output current, $I_{PARA\_AMP}$, provided by the parallel amplifier 35, the power efficiency of the pseudo-envelope follower power management system 10QA may be improved.

The parallel amplifier circuit 14Q may have a parallel amplifier circuit feedback delay associated with generation of the parallel amplifier circuit output current estimate 40, $I_{PAWA\_OUT\_EST}$, which is an estimate of the parallel amplifier circuit output current, $I_{PAWA\_OUT}$. In order to compensate for the delays in the pseudo-envelope follower power management system 10QA that may contribute to reduced power efficiency, the example embodiment of the pseudo-envelope follower power management system 10QA depicted in FIG. 3A further includes a feedback delay compensation circuit 852 configured to minimize the negative impact of feedback delay on the power conversion efficiency of the pseudo-envelope follower power management system 10QA.

In some embodiments of the pseudo-envelope follower power management system 10QA, the feedback delay compensation circuit 852 may be incorporated into the multi-level charge pump buck converter 12Q. For the sake of simplicity of description of operation of the feedback delay compensation circuit 852, and not by way of limitation, the operation and functionality of the multi-level charge pump buck converter 12Q may be similar to the operation and function of either the multi-level charge pump buck converter 12A, depicted in FIG. 2A, or the multi-level charge pump buck converter 12B, depicted in FIG. 2B. Also, for the sake of simplicity of description of the feedback delay compensation circuit 852, and not by way of limitation, neither the feed forward control signal 38, $V_{SWITCHER}$, nor the estimated switching voltage output 38B, $V_{SW\_EST}$, are depicted in FIG. 3A. In general, the multi-level charge pump buck converter 12Q is a switch mode power supply converter.

In some embodiments of the pseudo-envelope follower power management system 10QA, the feedback delay compensation circuit 852 may be incorporated into the multi-level charge pump buck converter 12Q. However, for the sake of simplicity of description, and not by way of limitation, the feedback delay compensation circuit 852, depicted in FIG. 3A, is shown as being separate from the multi-level charge pump buck converter 12Q.

Returning to the description of the feedback delay compensation circuit 852 depicted in FIG. 3A, some example embodiments of the feedback delay compensation circuit 852 may provide a feedback delay compensation signal 854, $I_{FEEDBACK\_TC}$, to the multi-level charge pump buck converter 12Q. As depicted in FIG. 3A, the switcher control circuit 52 may be configured to receive the parallel amplifier circuit output current estimate 40, $I_{PAWA\_OUT\_EST}$, and the threshold offset current 42, $I_{THRESHOLD\_OFFSET}$, and the feedback delay compensation signal 854, $I_{FEEDBACK\_TC}$. The switcher control circuit 52 may be further configured to use the parallel amplifier circuit output current estimate 40, $I_{PAWA\_OUT\_EST}$, and the threshold offset current 42, $I_{THRESHOLD\_OFFSET}$, and the feedback delay compensation signal 854, $I_{FEEDBACK\_TC}$, to govern the operation of the multi-level charge pump circuit 56 and the switching circuit 58 to control or govern the switching voltage, $V_{SW}$, provided at the switching voltage output 26 of the multi-level charge pump buck converter 12Q.

In this regard, in one embodiment of the multi-level charge pump buck converter 12Q in particular and the switch mode power supply converter in general, the switch mode power supply converter receives the estimate of the parallel amplifier circuit output current, $I_{PAWA\_OUT}$ from the parallel amplifier circuit 14Q. The switch mode power supply converter generates a composite feedback signal (not shown) based on a combination of the estimate of the parallel amplifier circuit output current, $I_{PAWA\_OUT}$ and the feedback delay compensation signal 854, $I_{FEEDBACK\_TC}$. The switch mode power supply converter compares the composite feedback signal (not shown) to a group of threshold levels to determine a group of comparison outputs (not shown) of the switch mode power supply converter. The switch mode power supply converter governs generation of the switching voltage, $V_{SW}$, based on the group of comparison outputs. In one embodiment of the group of threshold levels, the group of threshold levels consists of a shunt threshold level, a series threshold level, a first boost threshold level, and a second boost threshold level. In an alternate embodiment of the group of threshold levels, the group of threshold levels consists of a shunt threshold level, a series threshold level, and a first boost threshold level. In another embodiment of the group of threshold levels, the group of threshold levels consists of a shunt threshold level and a series threshold level.

FIG. 3A further depicts that the feedback delay compensation circuit 852 may be coupled to the battery 20 and configured to communicate with the controller 50 via the control bus 44. The feedback delay compensation circuit 852 may generate the feedback delay compensation signal 854, $I_{FEEDBACK\_TC}$, based on a slope of a derivative of the $V_{RAMP}$ signal. For example, the feedback delay compensation circuit 852 may determine the slope of the derivative of the $V_{RAMP}$ signal by high pass filtering the $V_{RAMP}$ signal with a capacitor/resistor network (not shown), where the capacitor/resistor network (not shown) has a high pass corner frequency, $f_{HP\_CF}$. Alternatively, the feedback delay compensation circuit 852 may determine the slope of the derivative of the $V_{RAMP}$ signal by high pass filtering the $V_{RAMP}$ signal with an active filter (not shown) to generate the derivative of the $V_{RAMP}$ signal, where the active filter (not shown) has a high pass corner frequency, $f_{HP\_CF}$.

In addition, in some embodiments, the feedback delay compensation circuit 852 may be coupled to the controller via the control bus 44, a capacitor array control bus 856, or a combination thereof. In some embodiments, the controller 50 may be configured to modify the high pass corner frequency, $f_{HP\_CF}$, and control the 90 degree phase lead of the high pass filtering response in order to maximize the power efficiency of either the parallel amplifier 35 or the pseudo-envelope follower power management system 10QA as a whole.

Prior to discussing the operation of the multi-level charge pump buck converter 12Q with respect to the feedback delay compensation signal 854, $I_{FEEDBACK\_TC}$, the embodiments of the feedback delay compensation circuit 852 depicted in FIG. 4A and FIG. 4B will be described. FIG. 4B depicts a feedback delay compensation circuit 852A, which is a differential embodiment of the feedback delay compensation circuit 852, depicted in FIG. 4A. As depicted in FIG. 4B, the $V_{RAMP}$ signal may be a differential $V_{RAMP}$ signal having a non-inverted $V_{RAMP}$ signal component, $V_{RAMP}+$, and an inverted $V_{RAMP}$ signal component, $V_{RAMP}-$.

Figure 4A:
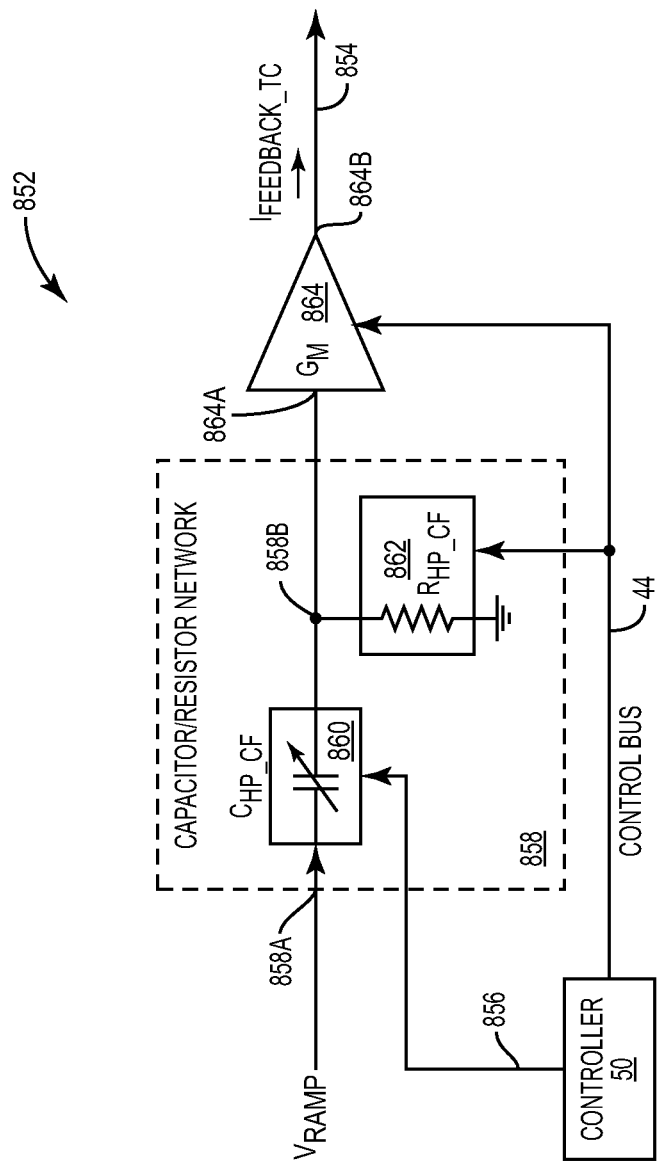
FIG. 4A depicts a block diagram of an embodiment of the feedback delay compensation circuit of FIG. 3A and FIG. 3B.
Figure 4B:
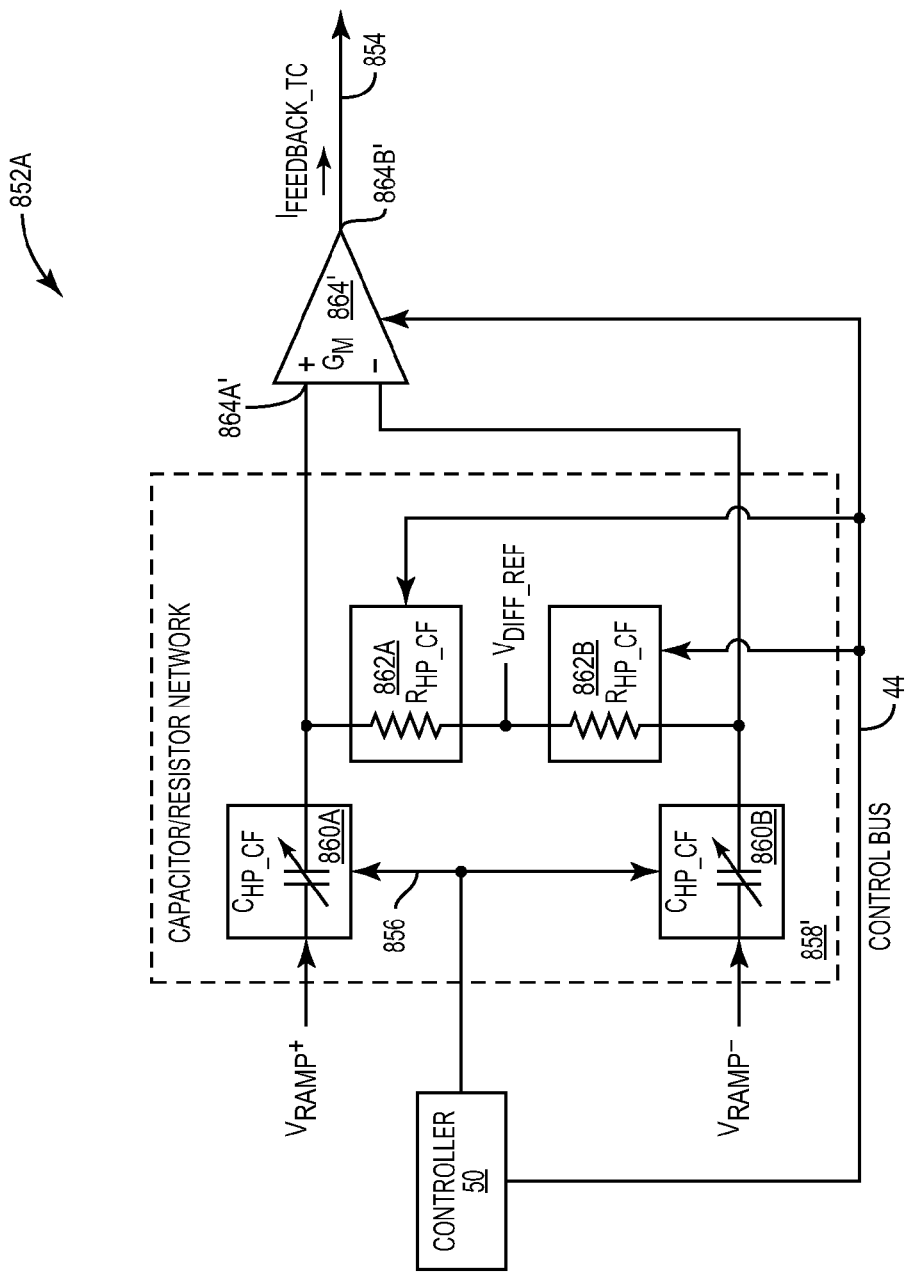
FIG. 4B depicts another embodiment of the feedback delay compensation circuit of FIG. 3A and FIG. 3B.

FIG. 4A depicts an example embodiment of the feedback delay compensation circuit 852, which will be discussed with continuing reference to FIG. 3A. The feedback delay compensation circuit 852 includes a capacitor/resistor network 858 having a high pass derivative filter capacitor 860 and a high pass derivative filter resistor 862 and a Gm feedback compensation circuit 864. The Gm feedback compensation circuit 864 is a transconductance circuit having a transconductance. In one embodiment of the transconductance circuit, the transconductance is programmable. In one embodiment of the transconductance circuit, the transconductance circuit receives the derivative of the $V_{RAMP}$ signal and generates the feedback delay compensation signal 854, $I_{FEEDBACK\_TC}$ based on the derivative of the $V_{RAMP}$ signal and the transconductance.

The Gm feedback compensation circuit 864 may include an input port 864A and a feedback delay compensation signal output 864B configured to provide the feedback delay compensation signal 854, $I_{FEEDBACK\_TC}$. The capacitor/resistor network 858 may have an input port 858A configured to receive the $V_{RAMP}$ signal. The capacitor/resistor network 858 may have an output port 858B coupled to the input port 864A of the Gm feedback compensation circuit 864. The high pass derivative filter capacitor 860 is coupled between the input port 858A of the capacitor/resistor network 858 and the output port of the capacitor/resistor network 858. The high pass derivative filter resistor 862 is coupled between the output port 858B of the capacitor/resistor network 858 and ground. The output port 858B of the capacitor/resistor network 858 is coupled to the input port 864A of the Gm feedback compensation circuit 864.

The high pass derivative filter capacitor 860 may have a capacitance level substantially equal to a high pass corner frequency capacitance, $C_{HP\_CF}$. The high pass derivative filter resistor 862 may have a resistance level substantially equal to a high pass corner frequency resistance, $R_{HP\_CF}$. The high pass derivative filter capacitor 860 and the high pass derivative filter resistor 862 of the capacitor/resistor network 858 may be configured to form a high pass filter, which has a high pass time constant, which is equal to a product of the high pass corner frequency capacitance, $C_{HP\_CF}$ and the high pass corner frequency resistance, $R_{HP\_CF}$. In one embodiment of the high pass filter, the high pass filter is a programmable high pass filter, such that the high pass time constant is a programmable high pass time constant. The capacitor/resistor network 858 high pass filters the $V_{RAMP}$ signal to generate a high pass filtered $V_{RAMP}$ signal, which is a derivative of the $V_{RAMP}$ signal. The high pass filtered $V_{RAMP}$ signal provides a 90 degree phase lead below the high pass corner frequency, $f_{HP\_CF}$, of the capacitor/resistor network 858 as compared to the $V_{RAMP}$ signal, where the slope of the derivative of the $V_{RAMP}$ signal provides an indication of whether the target voltage for the power amplifier supply voltage, $V_{CC}$, is increasing or decreasing.

Because the derivative of the $V_{RAMP}$ signal is used to generate the feedback delay compensation signal 854, $I_{FEEDBACK\_TC}$, the feedback delay compensation signal 854, $I_{FEEDBACK\_TC}$, effectively provides a feedback current to the switcher control circuit 52 that has a 90 degree phase lead, as compared to the $V_{RAMP}$ signal, below the high pass corner frequency, $f_{HP\_CF}$, of the capacitor/resistor network 858. As a result, the feedback delay compensation signal 854, $I_{FEEDBACK\_TC}$, provides an early indication of the direction in which the target voltage for the power amplifier supply voltage, $V_{CC}$, is headed based to the switcher control circuit 52. For example, if the slope of the derivative of the $V_{RAMP}$ signal is positive, the feedback delay compensation signal 854, $I_{FEEDBACK\_TC}$, provides an indication that the target voltage for the power amplifier supply voltage, $V_{CC}$, is increasing to the switcher control circuit 52, which is independent of the parallel amplifier circuit output current estimate 40, $I_{PAWA\_OUT\_EST}$. Alternatively, when the slope of the derivative of the $V_{RAMP}$ signal is negative, the feedback delay compensation signal 854, $I_{FEEDBACK\_TC}$, provides an indication that the target voltage for the power amplifier supply voltage, $V_{CC}$, is decreasing to the switcher control circuit 52, which is also is independent of the parallel amplifier circuit output current estimate 40, $I_{PAWA\_OUT\_EST}$. For example, the switcher control circuit 52 may be configured to use the information contained in the feedback delay compensation signal 854, $I_{FEEDBACK\_TC}$, to raise or lower the effective thresholds used by the switcher control circuit 52 to control changes between modes of operation of the multi-level charge pump buck converter 12Q, where each mode of operation corresponds to a particular voltage level of the switching voltage, $V_{SW}$, provided at the switching voltage output 26 to the power inductor 16.

In general, in one embodiment of the feedback delay compensation circuit 852, the feedback delay compensation circuit 852 provides an early indication of a change of the target voltage for the power amplifier supply voltage, $V_{CC}$ via the feedback delay compensation signal 854, $I_{FEEDBACK\_TC}$. As such, the early indication of a change of the target voltage is based on the $V_{RAMP}$ signal. Additionally, the feedback delay compensation signal 854, $I_{FEEDBACK\_TC}$ is based on the derivative of the $V_{RAMP}$ signal and the feedback delay compensation signal 854, $I_{FEEDBACK\_TC}$ is provided to the multi-level charge pump buck converter 12Q as the early indication of the change of the target voltage.

The capacitor/resistor network 858 includes a high pass corner time constant, $\tau_{HF\_CF}$, substantially equal to the product of the high pass corner frequency capacitance, $C_{HP\_CF}$, and the high pass frequency resistance, $R_{HP\_CF}$. The high pass corner frequency, $f_{HP\_CF}$, of the capacitor/resistor network 858 is provided by equation (1) as follows:

$$f_{HP\_CF} = \frac{1}{(2 \times \Pi \times C_{HP\_CF} \times R_{HP\_CF})} \quad (1)$$

As will be discussed, in some embodiments of the feedback delay compensation circuit 852, the high pass corner frequency, $f_{HP\_CF}$, of the capacitor/resistor network 858 may be configured by the controller 50. For example, in some embodiments, the high pass corner frequency resistance, $R_{HP\_CF}$, of the high pass derivative filter resistor 862 may be a programmable resistance. For example, the high pass derivative filter resistor 862 may be a binary weighted resistor array. In other embodiments, the high pass derivative filter resistor 862 may be a fixed value resistor. Likewise, the high pass corner frequency capacitance, $C_{HP\_CF}$, of the high pass derivative filter capacitor 860 may be a programmable capacitance. For example, the high pass derivative filter capacitor 860 may be a binary weighted capacitor array. However, in some embodiments, the high pass derivative filter capacitor 860 may be a fixed value capacitor.

In some embodiments of the feedback delay compensation circuit 852, the controller 50 may be configured to change the high pass corner frequency, $f_{HP\_CF}$, to between 30 MHz to 50 MHz in 5 MHz increments. In other embodiments of the feedback delay compensation circuit 852, the feedback delay compensation circuit 852 may be configured to limit the bandwidth of the feedback delay compensation signal 854, $I_{FEEDBACK\_TC}$, to improve stability.

The Gm feedback compensation circuit 864 may be configured to generate the feedback delay compensation signal 854, $I_{FEEDBACK\_TC}$, based on the slope of the derivative output response of the capacitor/resistor network 858. In other words, the Gm feedback compensation circuit 864 may be configured to generate the feedback delay compensation signal 854, $I_{FEEDBACK\_TC}$, based on the high pass filtered $V_{RAMP}$ signal, where the slope of the high pass filtered $V_{RAMP}$ signal indicates the direction in which the target voltage for the power amplifier supply voltage, $V_{CC}$, is heading in response to the $V_{RAMP}$ signal. Because the feedback delay compensation signal 854, $I_{FEEDBACK\_TC}$, is based on the derivative of the $V_{RAMP}$ signal, the rate of change of the $V_{RAMP}$ signal results in a change in the magnitude (positive or negative) of the feedback delay compensation signal 854, $I_{FEEDBACK\_TC}$. For example, when the slope of the derivative of the $V_{RAMP}$ signal is positive, the Gm feedback compensation circuit 864 may be configured to source current such that the feedback delay compensation signal 854. $I_{FEEDBACK\_TC}$, has a positive magnitude. However, when the slope of the derivative of the $V_{RAMP}$ signal is negative, the Gm feedback compensation circuit 864 may be configured to sink current such that the feedback delay compensation signal 854, $I_{FEEDBACK\_TC}$, has a negative magnitude. In addition, the greater the slope of the derivative of the $V_{RAMP}$ signal, the larger the magnitude of the feedback delay compensation signal 854, $I_{FEEDBACK\_TC}$.

The Gm feedback compensation circuit 864 may be coupled to the controller 50 via control bus 44. The Gm feedback compensation circuit 864 may have a Gm feedback compensation transconductance, $Gm_{FEEDBACK\_TC}$. In some embodiments of the Gm feedback compensation circuit 864, the Gm feedback compensation transconductance, $Gm_{FEEDBACK\_TC}$, may be programmable by the controller 50. Accordingly, the controller 50 may adjust the magnitude of the feedback delay compensation signal 854, $I_{FEEDBACK\_TC}$, by increasing or decreasing the Gm feedback compensation transconductance, $Gm_{FEEDBACK\_TC}$. For example, in some cases, the controller 50 may increase or decrease the Gm feedback compensation transconductance, $Gm_{FEEDBACK\_TC}$, with an increment size of 0.1 A/V, where 0.7 A/V ≤ $Gm_{FEEDBACK\_TC}$ ≤ ⅓ A/V.

Figure 3B:
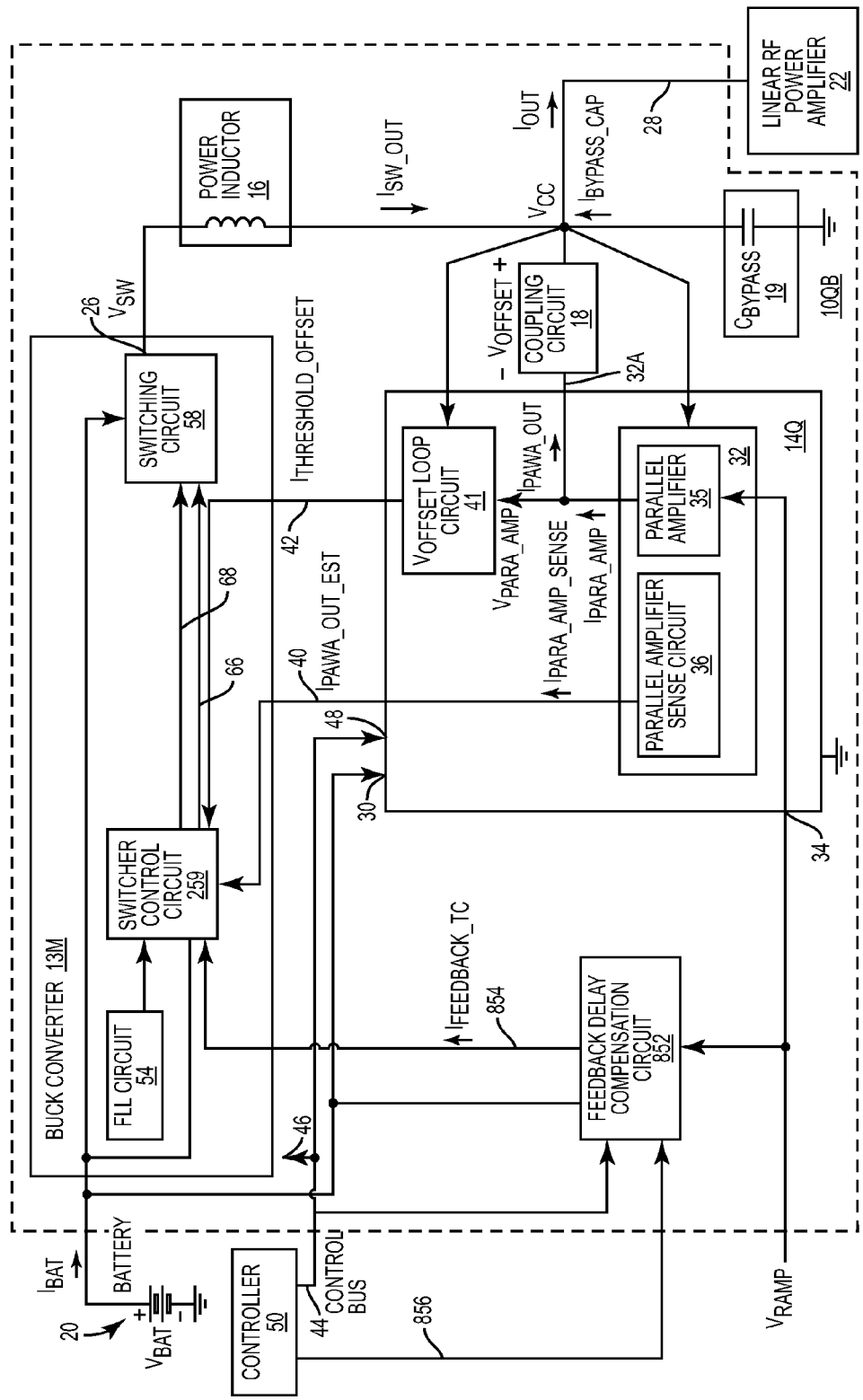
FIG. 3B depicts an example embodiment of a pseudo-envelope follower power management system that includes a feedback delay compensation circuit in combination with a buck converter.

As an example, in some embodiments of the pseudo-envelope follower power management system 10QA, the effects of feedback delay on the power efficiency of the parallel amplifier circuit 14Q may vary depending on the operational mode of the communication device. For example, the parallel amplifier circuit feedback delay may change depending on the configuration of the parallel amplifier circuit 14Q and/or the operational mode of the communication device. Alternatively, depending on the signal processing path associated with the operational mode of the communication device, the feedback delay of the parallel amplifier circuit 14Q may vary. As another example, the parallel amplifier feedback delay may vary depending on the configuration of the operation of the pseudo-envelope follower power management system 10QA and/or the parallel amplifier 35. For example, the parallel amplifier feedback delay may vary depending on the operational mode of the communication device or the band of operation that the communication device is using within a network. As another example, the feedback delay associated with the generation of the scaled high frequency ripple compensation current estimate $I_{COR\_SENSE}$, may be dependent upon the band of operation of the communication device or the temporal alignment of the frequency ripple compensation assist current. Thus, in some embodiments, the controller 50 may configure the high pass corner frequency, $f_{HP\_CF}$, based on the operational state of the parallel amplifier circuit 14Q in order to compensate for increases or decrease in the feedback delays associated with generation of the parallel amplifier circuit output current estimate 40, $I_{PAWA\_OUT\_EST}$, in order to maximize the power efficiency of the parallel amplifier circuit 14Q, the parallel amplifier 35, or the pseudo-envelope follower power management system 10QA, depicted in FIG. 3A, and the pseudo-envelope follower power management system 10QB, depicted in FIG. 3B. As such, the programmable high pass time constant of the programmable high pass filter may be based on the band of operation of the communication device.

The controller 50 may configure the high pass corner frequency, $f_{HP\_CF}$, of the high pass filter to set the apparent gain of the feedback delay compensation circuit 852 at a given frequency. As a non-limiting example, some embodiments of the feedback delay compensation circuit 852 may be configured such that the high pass corner frequency resistance, $R_{HP\_CF}$, is substantially equal to 25.3 KΩ. In addition, the high pass derivative filter capacitor 860 may be a binary capacitor array, where the high pass corner frequency capacitance, $C_{HP\_CF}$, may have a capacitance value that ranges between 0 Farads to 3 pF in increments substantially equal to 0.2 pF. When the capacitance of the high pass corner frequency capacitance, $C_{HP\_CF}$, equals zero Farads, the feedback delay compensation circuit 852 may be effectively disabled. For the case where the high pass corner frequency capacitance, $C_{HP\_CF}$, is configured to have a capacitance substantially equal to 0.2 pF, an apparent gain of the high pass derivative filter capacitor 860 may be substantially equal to −12 dBm at 10 MHz. However, for the case where the high pass corner frequency capacitance, $C_{HP\_CF}$, is configured to have a capacitance substantially equal to 3 pF, the apparent gain of the high pass derivative filter capacitor 860 may be substantially equal to 10 dBm at 10 MHz. Thus, the aggressiveness of the feedback compensation provided by the feedback delay compensation circuit 852 may be configured by adjusting the high pass corner frequency, $f_{HP\_CF}$. As an example, as the high pass corner frequency capacitance, $C_{HP\_CF}$, increases, the high pass corner frequency, $f_{HP\_CF}$, decreases, which increases the apparent gain of the feedback delay compensation circuit 852. Because the apparent gain of the feedback delay compensation circuit 852 is increased, the magnitude of the feedback delay compensation signal 854, $I_{FEEDBACK\_TC}$, increases, which tends to improve the power efficiency of the parallel amplifier circuit 14Q. For example, as the apparent gain of the feedback delay compensation circuit 852 is increased, the magnitude of the parallel amplifier output current, $I_{PARA\_AMP}$, generated by the parallel amplifier 35 may tend to decrease. However, in the case where the apparent gain of the feedback delay compensation circuit 852 is too high, the switcher control circuit 52 may prematurely change the switching voltage, $V_{SW}$, which may increase the magnitude of the parallel amplifier output current, $I_{PARA\_AMP}$, generated by the parallel amplifier 35. Thus, depending on the operational mode of the pseudo-envelope follower power management system 10QA and/or the band of operation of the communication device, the controller 50 may configure the high pass corner frequency, $f_{HP\_CF}$, of the high pass filter to maximize power efficiency of either the parallel amplifier 35 or the parallel amplifier circuit 14Q as a whole.

As another example, the controller 50 may configure the high pass corner time constant, $\tau_{HP\_CF}$, by programmably changing the capacitance of the high pass corner frequency capacitance $C_{HP\_CF}$, the resistance value of the high pass corner frequency resistance, $R_{HP\_CF}$, and/or a combination thereof. Similarly, the controller 50 may adjust the high pass corner frequency, $f_{HP\_CF}$, based on the operational state of the pseudo-envelope follower power management system 10QA in order to maximize power efficiency of the system. For example, during configuration of the pseudo-envelope follower power management system 10QA, the controller 50 may be configured to store high pass corner frequency parameters that correspond to various operational states of either the parallel amplifier 35, the pseudo-envelope follower power management system 10QA, and/or a combination thereof. Each of the stored high pass corner frequency parameters may be associated with a particular operational state of the parallel amplifier 35, the pseudo-envelope follower power management system 10QA, and/or a combination thereof. The high pass corner frequency parameters may include settings to adjust the value of the high pass corner frequency capacitance $C_{HP\_CF}$, the value of the high pass corner frequency resistance, $R_{HP\_CF}$, and/or a combination thereof. In some embodiments, only the high pass derivative filter capacitor 860 is configured to be programmable whereas the high pass derivative filter resistor 862 is configured to have a fixed value. In other embodiments, only the high pass derivative filter resistor 862 is configured to be programmable whereas the high pass derivative filter capacitor 860 is configured to have a fixed value.

As another example, the feedback delay compensation circuit 852 may be configured to set the high pass corner frequency, $f_{HP\_CF}$, to a first frequency value when the pseudo-envelope follower power management system 10QA is in a first operational mode and set the high pass corner frequency, $f_{HP\_CF}$, to a second frequency when the pseudo-envelope follower power management system 10QA is in a second operational mode in order to maximize the power efficiency of the pseudo-envelope follower power management system 10QA in each operational mode. Alternatively, the high pass corner frequency, $f_{HP\_CF}$, may be set only during calibration of the pseudo-envelope follower power management system 10QA. The high pass corner frequency, $f_{HP\_CF}$, may be independently set from the bandwidth of the feedback delay compensation signal 854, $I_{FEEDBACK\_TC}$. For example, the controller 50 may configure the Gm feedback compensation circuit 864 to limit the frequency pass band of the Gm feedback compensation circuit 864 in order to the improve stability of the pseudo-envelope follower power management system 10QA when operating in a particular operational mode. For example, for the case where the feedback delay of the parallel amplifier circuit is 5 ns, the controller 50 may configure the high pass corner frequency, $f_{HP\_CF}$, to be substantially equal to 40 MHz and the Gm feedback compensation transconductance, $Gm_{FEEDBACK\_TC}$, to be substantially equal to 1 A/V in order to maximize the power efficiency of the parallel amplifier 35.

As an example, the high pass derivative filter capacitor 860 may be coupled to the controller 50 via the capacitor array control bus 856. The high pass derivative filter capacitor 860 may be configured to be a binary weighted programmable capacitor array. The high pass derivative filter capacitor 860 may include several capacitors arranged in parallel that may be switched in parallel to provide an equivalent capacitance level. The high pass derivative filter capacitor 860 may also have a bypass mode to set the high pass corner frequency capacitance, $C_{HP\_CF}$, equal to zero Farads. The capacitor array control bus 856 may be multi-bit control bus configured to selectively switch in or out one or more of the binary weighted capacitors that are in a parallel arrangement or to switch into a bypass mode. The capacitor array control bus 856 may include multiple bits that may form a binary word that may be used by the controller 50 to control the capacitance of the high pass derivative filter capacitor 860. The high pass derivative filter capacitor 860 may be configured to be a binary weighted programmable capacitor array such that the effective capacitance of the high pass derivative filter capacitor 860 may be a linearly controlled capacitance. For example, in some embodiments of the feedback delay compensation circuit 852, the high pass corner frequency capacitance, $C_{HP\_CF}$ of the high pass derivative filter capacitor 860 may be controlled by controller 50 to have a capacitance range of between 0.2 pF to 3 pF. As a result, the high pass filter having a high pass corner frequency, $f_{HP\_CF}$, of the capacitor/resistor network 858 may be adjusted by modifying the high pass corner frequency capacitance, $C_{HP\_CF}$, of the high pass derivative filter capacitor 860.

FIG. 4B depicts a differential feedback delay compensation circuit 852A, which is another embodiment of the feedback delay compensation circuit 852 depicted in FIG. 4A. The differential feedback delay compensation circuit 852A will be discussed with continuing reference to FIG. 4A. The differential feedback delay compensation circuit 852A functions in a similar fashion as the previously described feedback delay compensation circuit 852, depicted in FIG. 4A, except the signal processing is done differentially. The differential feedback delay compensation circuit 852A may be configured to generate the feedback delay compensation signal 854, $I_{FEEDBACK\_TC}$, based on the derivative of the differential $V_{RAMP}$ signal.

FIG. 4B depicts a differential capacitor/resistor network 858' configured to receive the differential $V_{RAMP}$ signal. In some embodiments, the differential capacitor/resistor network 858' is a differential high pass filter. Similar to the capacitor/resistor network 858, depicted in FIG. 4A, the differential capacitor/resistor network 858' may act as a high pass filter to provide the derivative of the differential $V_{RAMP}$ signal, where the high pass filter has a high pass corner frequency, $f_{HP\_CF}$, that corresponds to the high pass corner time constant, $\tau_{HF\_CF}$. The differential capacitor/resistor network 858' includes a non-inverted high pass filter input configured to receive the non-inverted $V_{RAMP}+$ signal component and an inverted high pass filter input configured to receive the inverted $V_{RAMP}$ signal component, $V_{RAMP}-$. The differential capacitor/resistor network 858' may include a non-inverted high pass filtered output and an inverted high pass filtered output. The non-inverted high pass filtered output may be formed by coupling a first high pass derivative filter capacitor 860A to a first high pass derivative filter resistor 862A, where the first high pass derivative filter resistor 862A is coupled between the non-inverted high pass filtered output and a differential reference voltage, $V_{DIFF\_REF}$. The inverted high pass filtered output may be formed by coupling a second high pass derivative filter capacitor 860B to a second high pass derivative filter resistor 862B, where the second high pass derivative filter resistor 862B is coupled between the inverted high pass filtered output and the differential reference voltage, $V_{DIFF\_REF}$. The first high pass derivative filter capacitor 860A may be coupled between the non-inverted high pass filtered input and the non-inverted high pass filtered output. The second high pass derivative filter capacitor 860B may be coupled between the inverted high pass filter input and the inverted high pass filtered output. The differential reference voltage, $V_{DIFF\_REF}$, may provide a common voltage reference for the non-inverted $V_{RAMP}$ signal component, $V_{RAMP}+$, and the inverted $V_{RAMP}$ signal component, $V_{RAMP}-$. In some embodiments the differential reference voltage, $V_{DIFF\_REF}$, is tied to ground. The differential capacitor/resistor network 858' high pass filters the differential $V_{RAMP}$ signal to generate a high pass filtered $V_{RAMP}$ signal, where the high pass filtered $V_{RAMP}$ signal is used as the derivative of the $V_{RAMP}$ signal. The high pass filtered $V_{RAMP}$ signal is provided as a differential signal between the non-inverted high pass filtered output and the inverted high pass filtered output.

The first high pass derivative filter capacitor 860A and the second high pass derivative filter capacitor 860B may each be configured as a binary capacitor array that is similar in form and function to the high pass derivative filter capacitor 860. Via the capacitor array control bus 856, the controller 50 may configure the capacitance value of the first high pass derivative filter capacitor 860A and the second high pass derivative filter capacitor 860B to be substantially equal to the high pass corner frequency capacitance, $C_{HP\_CF}$. As a non-limiting example, the high pass corner frequency capacitance, $C_{HP\_CF}$, may have a capacitance between 0 farads and 3 pF in increments substantially equal to 0.2 pF.

When the capacitance of the high pass corner frequency capacitance, $C_{HP\_CF}$, equals zero, the differential feedback delay compensation circuit 852A may be effectively disabled. Similarly, in some embodiments, the first high pass derivative filter resistor 862A and the second high pass derivative filter resistor 862B may be configured as binary resistor arrays. Via the control bus 44, the controller 50 may configure the first high pass derivative filter resistor 862A and the second high pass derivative filter resistor 862B to have a resistance level substantially equal to the high pass corner frequency resistance, $R_{HP\_CF}$. The differential capacitor/resistor network 858' has a high pass corner time constant, $\tau_{HF\_CF}$. The high pass corner time constant, $\tau_{HF\_CF}$, is the product of the high pass corner frequency capacitance, $C_{HP\_CF}$, and the high pass frequency resistance, $R_{HP\_CF}$. The controller 50 may be configured to adjust the high pass corner frequency capacitance, $C_{HP\_CF}$, the high pass frequency resistance, $R_{HP\_CF}$, and/or a combination thereof in order to configure the high pass corner time constant, $\tau_{HF\_CF}$. However, in some embodiments, (not shown) the first high pass derivative filter capacitor 860A and the second high pass derivative filter capacitor 860B may be fixed value capacitors while the first high pass derivative filter resistor 862A and the second high pass derivative filter resistor 862B may be programmable. In other embodiments, the first high pass derivative filter capacitor 860A and the second high pass derivative filter capacitor 860B may be programmable while the first high pass derivative filter resistor 862A and the second high pass derivative filter resistor 862B have a fixed value.

A differential Gm feedback compensation circuit 864' includes an inverting input and a non-inverting input. The differential Gm feedback compensation circuit 864' is a differential transconductance circuit having a transconductance. In one embodiment of the differential transconductance circuit, the transconductance is programmable. The non-inverting input of the differential Gm feedback compensation circuit 864' may be in communication with the first high pass derivative filter capacitor 860A and the first high pass derivative filter resistor 862A, which form the non-inverted high pass filtered output of the differential capacitor/resistor network 858'. The inverting input of the differential Gm feedback compensation circuit 864' may be in communication with the second high pass derivative filter capacitor 860B and the second high pass derivative filter resistor 862B, which form the inverted high pass filtered output of the differential capacitor/resistor network 858'. The differential Gm feedback compensation circuit 864' may be configured to generate the feedback delay compensation signal 854, $I_{FEEDBACK\_TC}$, based on the derivative output response of the differential capacitor/resistor network 858'. In the case where the slope of the derivative of the differential $V_{RAMP}$ signal is positive, the magnitude of the feedback delay compensation signal 854, $I_{FEEDBACK\_TC}$, is a positive. As a result, the differential Gm feedback compensation circuit 864' sources current when the slope of the derivative of the differential $V_{RAMP}$ signal is positive. In the case where the slope of the derivative of the differential $V_{RAMP}$ signal is negative, the feedback delay compensation signal 854, $I_{FEEDBACK\_TC}$, is a negative current. In other words, the differential Gm feedback compensation circuit 864' sinks current when the slope of the derivative of the $V_{RAMP}$ signal is negative. Similar to the Gm feedback compensation circuit 864, depicted in FIG. 4A, the differential Gm feedback compensation circuit 864' also has a Gm feedback compensation transconductance, $Gm_{FEEDBACK\_TC}$, that may be configured by the controller 50. Similar to the feedback delay compensation circuit 852, depicted in FIG. 4A, the controller 50 may configure the Gm feedback compensation transconductance, $Gm_{FEEDBACK\_TC}$, of the differential Gm feedback compensation circuit 864' to optimize or calibrate the magnitude of the feedback delay compensation signal 854, $I_{FEEDBACK\_TC}$.

Returning to FIG. 3A, the application of the feedback delay compensation signal 854, $I_{FEEDBACK\_TC}$, in the multi-level charge pump buck converter 12Q will now be discussed. For the sake of simplicity, and not by way of limitation, the parallel amplifier circuit output current estimate 40, $I_{PAWA\_OUT\_EST}$, is assumed to be substantially equal to the scaled parallel amplifier output current estimate, $I_{PARA\_AMP\_SENSE}$. Accordingly, the parallel amplifier circuit output current estimate 40, $I_{PAWA\_OUT\_EST}$, reflects the magnitude of the parallel amplifier output current, $I_{PARA\_AMP}$, generated by the parallel amplifier 35.

Although the feedback delay compensation signal 854, $I_{FEEDBACK\_TC}$, provides a 90 degree phase lead with respect to the $V_{RAMP}$ signal, the feedback delay compensation circuit 852 may have a signal generation propagation delay associated with generation of the feedback delay compensation signal 854, $I_{FEEDBACK\_TC}$. In order to temporally align the feedback delay compensation signal 854, $I_{FEEDBACK\_TC}$, with the operation of the parallel amplifier 35, the parallel amplifier circuit delay may be adjusted. As an example, in some embodiments, the parallel amplifier circuit 14Q may be configured to add a feedback compensation propagation delay between the first control input 34 and the output of the parallel amplifier 35. As an example, the parallel amplifier circuit delay may be a fixed delay added to the parallel amplifier 35, the parallel amplifier circuitry 32, and/or a combination thereof. In other embodiments, the feedback compensation propagation delay may be added by adjusting the propagation time through a combination of the pre-processing circuitry, the parallel amplifier circuitry 32, the parallel amplifier 35, and/or a combination thereof. In other embodiments, the parallel amplifier circuit delay may be a programmable delay that is configured by the controller 50.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
   a switch mode power supply converter having a switching voltage output and configured to provide a switching voltage at the switching voltage output, such that a target voltage for a power amplifier supply voltage at a power amplifier supply output is based on the switching voltage, which is based on an early indication of a change of the target voltage; and
   a feedback delay compensation circuit comprising a high pass filter configured to high pass filter a $V_{RAMP}$ signal to generate a derivative of the $V_{RAMP}$ signal, such that the feedback delay compensation circuit is configured to:
   generate a feedback delay compensation signal based on the derivative of the $V_{RAMP}$ signal; and
   provide the feedback delay compensation signal to the switch mode power supply converter as the early indication of the change of the target voltage.

2. The circuitry of claim 1 wherein a power inductive element is coupled between the switching voltage output and the power amplifier supply output.

3. The circuitry of claim 1 further comprising a parallel amplifier circuit, such that the switch mode power supply converter and the parallel amplifier circuit are configured to operate in tandem to generate the power amplifier supply voltage for a radio frequency power amplifier.

4. The circuitry of claim 3 wherein the parallel amplifier circuit is further configured to regulate the power amplifier supply voltage based on a difference between a $V_{RAMP}$ signal and the power amplifier supply voltage.

5. The circuitry of claim 4 wherein the early indication of the change of the target voltage is based on the $V_{RAMP}$ signal.

6. The circuitry of claim 4 wherein the $V_{RAMP}$ signal is representative of required supply modulation information for a power amplifier collector of the radio frequency power amplifier.

7. The circuitry of claim 3 wherein the parallel amplifier circuit has a parallel amplifier output, such that a coupling circuit is coupled between the parallel amplifier output and the power amplifier supply output.

8. The circuitry of claim 7 wherein the coupling circuit comprises an offset capacitive element.

9. The circuitry of claim 1 wherein the high pass filter is a differential high pass filter.

10. The circuitry of claim 1 wherein the high pass filter has a programmable high pass time constant.

11. The circuitry of claim 10 wherein the programmable high pass time constant is based on a band of operation of a communication device.

12. Circuitry comprising:
a switch mode power supply converter having a switching voltage output and configured to provide a switching voltage at the switching voltage output, such that a target voltage for a power amplifier supply voltage at a power amplifier supply output is based on the switching voltage, which is based on an early indication of a change of the target voltage; and
a feedback delay compensation circuit, which comprises a transconductance circuit having a transconductance, and is configured to:
generate a feedback delay compensation signal based on a derivative of a $V_{RAMP}$ signal and the transconductance; and
provide the feedback delay compensation signal to the switch mode power supply converter as the early indication of the change of the target voltage.

13. The circuitry of claim 12 wherein the transconductance is programmable.

14. The circuitry of claim 12 wherein the transconductance circuit is a differential transconductance circuit.

15. The circuitry of claim 1 wherein the switch mode power supply converter is further configured to:
receive a parallel amplifier circuit output current estimate from a parallel amplifier circuit;
generate a composite feedback signal based on a combination of the parallel amplifier circuit output current estimate and the feedback delay compensation signal;
compare the composite feedback signal to a plurality of threshold levels to determine a plurality of comparison outputs of the switch mode power supply converter; and
govern generation of the switching voltage based on the plurality of comparison outputs.

16. The circuitry of claim 15 wherein the plurality of threshold levels consists of a shunt threshold level and a series threshold level.

17. The circuitry of claim 15 wherein the plurality of threshold levels consists of a shunt threshold level, a series threshold level, and a first boost threshold level.

18. The circuitry of claim 15 wherein the plurality of threshold levels consists of a shunt threshold level, a series threshold level, a first boost threshold level, and a second boost threshold level.

19. A method comprising:
providing a switching voltage at a switching voltage output, such that a target voltage for a power amplifier supply voltage at a power amplifier supply output is based on the switching voltage, which is based on an early indication of a change of the target voltage;
high pass filtering a $V_{RAMP}$ signal to generate a derivative of the $V_{RAMP}$ signal;
generating a feedback delay compensation signal based on the derivative of the $V_{RAMP}$ signal; and
providing the feedback delay compensation signal as the early indication of the change of the target voltage.

* * * * *